(12) United States Patent
Debashis et al.

(10) Patent No.: US 12,406,713 B2
(45) Date of Patent: Sep. 2, 2025

(54) PROBABILISTIC COMPUTING DEVICES BASED ON STOCHASTIC SWITCHING IN A FERROELECTRIC FIELD-EFFECT TRANSISTOR

(71) Applicant: Intel Corporation, Santa Clara, CA (US)

(72) Inventors: Punyashloka Debashis, Hillsboro, OR (US); Dmitri Evgenievich Nikonov, Beaverton, OR (US); Hai Li, Portland, OR (US); Chia-Ching Lin, Portland, OR (US); Raseong Kim, Portland, OR (US); Tanay A. Gosavi, Portland, OR (US); Ashish Verma Penumatcha, Beaverton, OR (US); Uygar E. Avci, Portland, OR (US); Marko Radosavljevic, Portland, OR (US); Ian Alexander Young, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 864 days.

(21) Appl. No.: 17/409,483

(22) Filed: Aug. 23, 2021

(65) Prior Publication Data
US 2023/0058938 A1    Feb. 23, 2023

(51) Int. Cl.
*G11C 11/22* (2006.01)
*H10B 51/30* (2023.01)

(52) U.S. Cl.
CPC ........ *G11C 11/2275* (2013.01); *G11C 11/223* (2013.01); *G11C 11/2273* (2013.01); *H10B 51/30* (2023.02); *G11C 11/2293* (2013.01)

(58) Field of Classification Search
CPC .............. G11C 11/2275; G11C 11/223; G11C 11/2273; G11C 11/2293; H10B 51/30
USPC ......................................................... 365/145
See application file for complete search history.

(56) References Cited

U.S. PATENT DOCUMENTS

| | | | |
|---|---|---|---|
| 9,935,105 B2 * | 4/2018 | Yabuuchi | H10D 89/10 |
| 11,342,927 B1 * | 5/2022 | Lim | H03L 7/0995 |
| 2008/0024181 A1 * | 1/2008 | Wada | G11C 29/023 |
| | | | 327/161 |
| 2019/0273087 A1 * | 9/2019 | Morris | H10D 30/6735 |

(Continued)

OTHER PUBLICATIONS

Deng, Shan, et al. "A Comprehensive Model for Ferroelectric FET Capturing the Key Behaviors: Scalability, Variation, stochasticity, and Accumulation." 2020 IEEE Symposium on VLSI Technology. IEEE, 2020.

(Continued)

*Primary Examiner* — Connie C Yoha
(74) *Attorney, Agent, or Firm* — Alliance IP, LLC

(57) ABSTRACT

A pbit device, in one embodiment, includes a first field-effect transistor (FET) that includes a source region, a drain region, a source electrode on the source region, a drain electrode on the drain region, a channel region between the source and drain regions, a dielectric layer on a surface over the channel region, an electrode layer above the dielectric layer, and a ferroelectric (FE) material layer between the dielectric layer and the electrode layer. The pbit device also includes a second FET comprising a source electrode, a drain electrode, and a gate electrode. The drain electrode of the second FET is connected to the drain electrode of the first FET.

24 Claims, 16 Drawing Sheets

(56) References Cited

U.S. PATENT DOCUMENTS

2024/0243714 A1* 7/2024 Pattipaka ................ H04B 1/04

OTHER PUBLICATIONS

Mulaosmanovic, Halid, Thomas Mikolajick, and Stefan Slesazeck. "Random number generation based on ferroelectric switching." IEEE Electron Device Letters 39.1 (2017): 135-138.
Shin, Young-Han, et al. "Nucleation and growth mechanism of ferroelectric domain-wall motion." Nature 449.7164 (2007): 881-884.

* cited by examiner

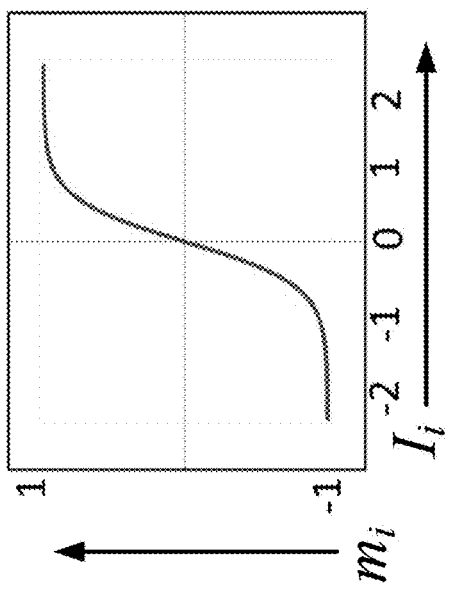
FIG. 1A
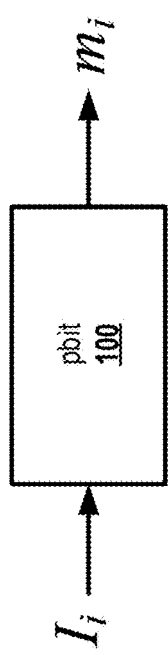
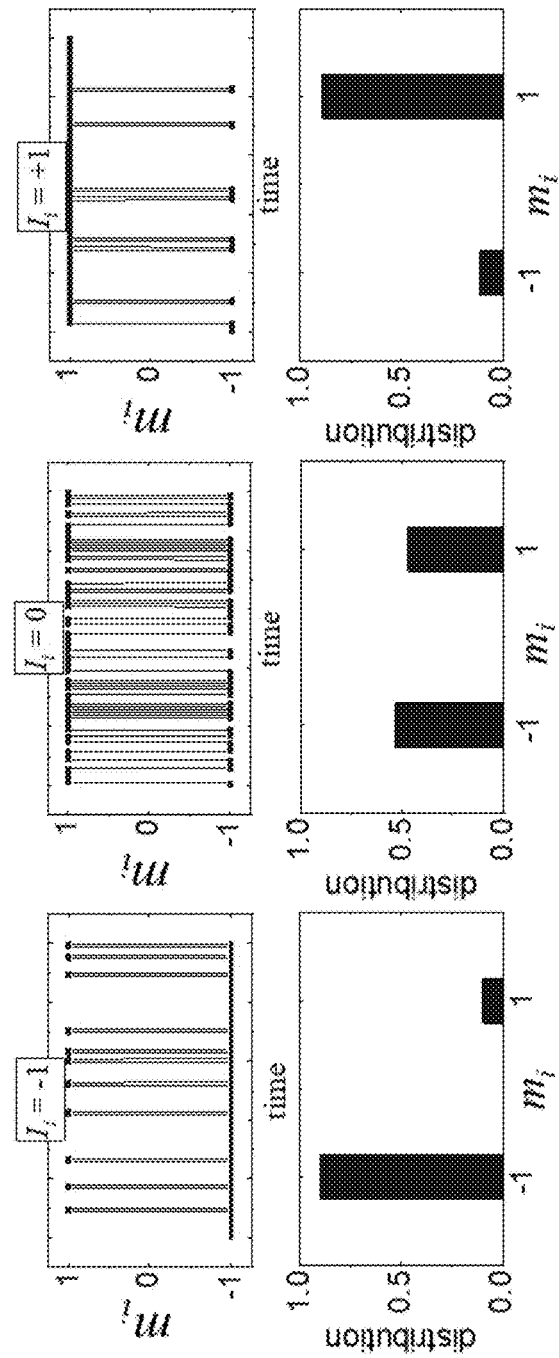
FIG. 1B
FIG. 1C $$E = -\left(\sum_i \sum_j J_{ij} s_i s_j + \sum_i h_i s_i\right)$$

PROBABILISTIC COMPUTING DEVICES BASED ON STOCHASTIC SWITCHING IN A FERROELECTRIC FIELD-EFFECT TRANSISTOR

BACKGROUND

Probabilistic computing has been shown to provide large power, performance, and area improvements compared to traditional complementary metal-oxide-semiconductor (CMOS) devices for artificial intelligence (AI)-based compute applications, such as optimization and sampling. The key enabler for probabilistic computing is a hardware called a "pbit" that utilizes intrinsic physics to generate binary random numbers with tunable probability. This intrinsic property of the pbit enables parallel and autonomous minimization of a cost function that can be designed to represent the solution to computationally hard problems of practical interest, such as the traveling salesman problem, integer factorization, Bayesian networks, etc.

BRIEF DESCRIPTION OF THE DRAWINGS

FIGS. 1A-1C illustrate an example probabilistic pbit device and operational characteristics of the pbit device.

DETAILED DESCRIPTION

Figure 2A:
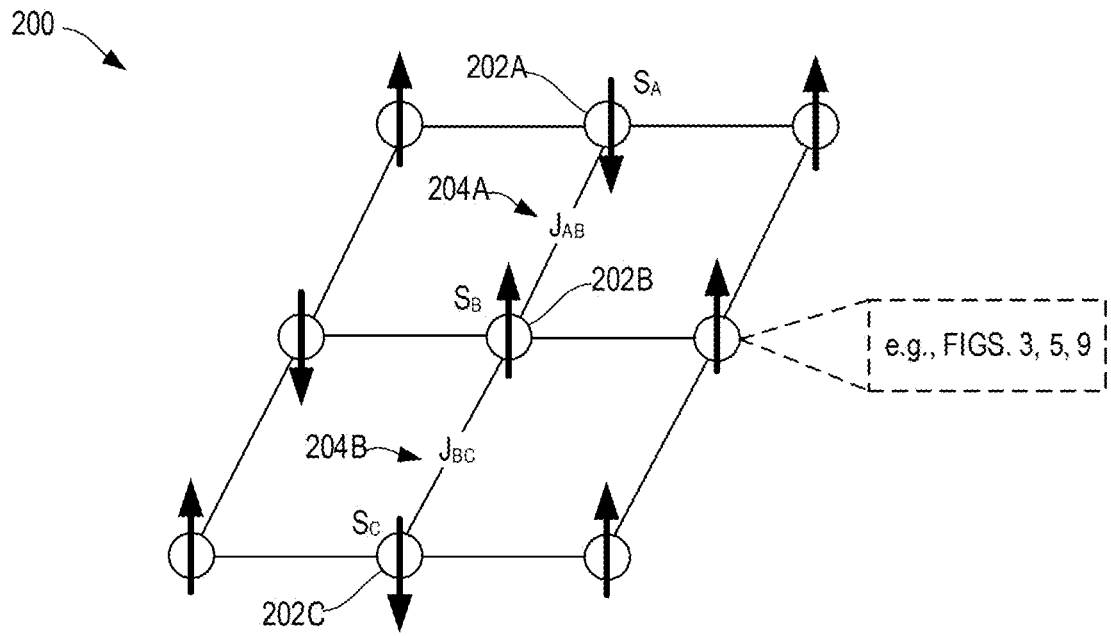
FIGS. 2A-2B illustrate an example Ising network and its associated characteristics.

Probabilistic computing has been shown to provide large power, performance, and area improvements compared to traditional complementary metal-oxide-semiconductor (CMOS) devices for artificial intelligence (AI)-based compute applications, such as optimization and sampling. The key enabler for probabilistic computing is a hardware called a "pbit" that utilizes intrinsic physics to generate binary random numbers with tunable probability. This intrinsic property of the pbit enables parallel and autonomous minimization of a cost function that can be designed to represent the solution to computationally hard problems of practical interest, such as the traveling salesman problem, integer factorization, Bayesian networks, etc.

Previous solutions have discussed magnetic tunnel junctions (MTJs) with a thermally unstable free layer for providing the intrinsic stochasticity, owing to its technology maturity, room temperature operation and compatibility with CMOS BEOL. In such devices, the unstable MTJ in series with a NMOS transistor forms the tunable random number generator. A CMOS inverter is utilized to amplify the stochastic voltage fluctuations at the NMOS drain node. This forms the complete spintronic pbit. However, MTJs have a relatively small output ratio of around 100% that comes from the change in the device resistance as the magnetization of the free layer switches between parallel and antiparallel orientation with respect to the reference layer magnetization. Therefore, the CMOS inverter is required to amplify the signal, but can introduce its own source of noise and additional device footprint. Moreover, being magnetic devices, the spintronic pbits are prone to external magnetic attacks and present a challenge to minimize the stray magnetic fields coming from neighboring devices within such a chip.

In contrast, aspects of the present disclosure utilize new pbit devices that incorporate FE-based field-effect transistor (FEFET or FeFET) designs. In such devices, a FE material may be used between a gate electrode and the channel of the FET. The intrinsically probabilistic/stochastic nature of the FE polarization switching (as a function of voltage pulse amplitude or duration) can be used in certain embodiments to encode the probability of the pbit device. When a series of voltage pulses are applied to the gate of the FeFET, its threshold voltage can switch randomly between a large ($V_{T,high}$) and small ($V_{T,low}$) value, with a probability that depends on the gate voltage pulse height, width, or the voltage of another terminal.

FE-based pbit devices may have one or more advantages over its traditional spintronics counterpart. For example, FE-based pbit devices may have an output ratio that is orders of magnitude larger than magnetic pbit devices, as it is derived from the change in the transistors drain current as opposed to the tunnel magnetoresistance effect. In addition, FE-based pbit devices may be robust against magnetic attacks or internal magnetic fields produced within the chip, since the core element is the ferroelectric polarization switching, which is a charge-based phenomenon. As another example, FE switching is potentially faster than FM switching. Hence, the speed of operation of the FE-based pbit device may be faster when compared to its spintronics counterpart. As yet another example, since the pbit device output only changes after the application of a gate voltage pulse, its operation speed is more robust against device-to-device variation compared to spontaneously fluctuating pbits whose magnetic parameters determine the device operation speed.

FIGS. 1A-1C illustrate an example probabilistic pbit device 100 and operational characteristics of the pbit device. In particular, FIG. 1A illustrates a probabilistic pbit device that accepts an input $I_i$ and produces a probabilistic output $m_i$. The probabilistic characteristics of the pbit device 100 are shown in FIGS. 1B-1C. For instance, FIG. 1B illustrates instantaneous random fluctuations of the output $m_i$ for three different inputs $I_i$ (−1, 0, 1). As shown, the output signal $m_i$ fluctuates in a seemingly random nature for the same input signal $I_i$; however, the long term average of the output signal $m_i$ demonstrates a probabilistic distribution as shown in FIG. 1C. FIG. 1B illustrates a histogram of example output states, showing that the input changes the probability distribution of the probabilistic output. As shown in FIG. 1C, the long-term average of the output $m_i$ as a function of $I_i$ shows a sigmoidal response.

This probabilistic nature of the pbit device 100 can be utilized to design devices that model certain problems of interest, e.g., optimization and/or sampling problems. For instances, a set of pbit devices can be interconnected in a networked way to model such problems. As an example, a set of pbit devices with responses modeled by the neuron equation:

$$m_i = \text{sign}[\tanh I_i - rnd_{(-1,1)}]$$

can be interconnected through weights $W_{ij}$ as shown in the synapse equation:

$$I_i = \beta \Sigma W_{ij} \times m_j$$

By designing an appropriate weight matrix $[W_{ij}]$, many problems of practical interest such as optimization and sampling can be mapped onto this pbit-based hardware device.

Figure 2B:
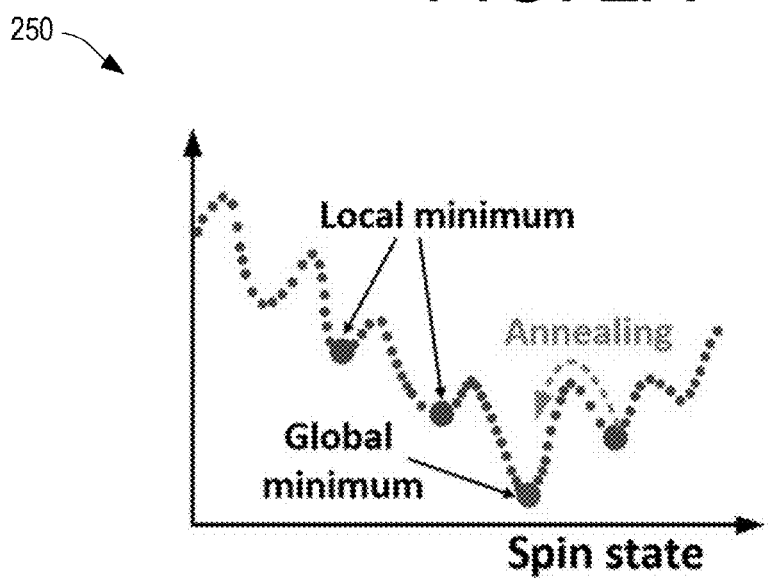

FIGS. 2A-2B illustrate an example Ising network 200 and its associated characteristics. The example Ising network 200 shown in FIG. 2A may be used, in certain embodiments, to solve combinatorial optimization problems or other types of problems. In the example shown, the Ising network 200 includes a set of interconnected pbit devices 202 with particular spins (S), which can take values of +1 (up) or −1 (down) randomly. Each spin is connected to its neighbors through weighted interconnections that determines the probability of the spin being in the +1 or −1 state. Overall, the network has an energy E, which depends on the configuration of the spins. For instance, the pbit device 202A has a spin $S_A$ that is −1/down, pbit device 202B has a spin $S_B$ that is +1/up, and the pbit device 202C has a spin $S_C$ that is −1/down. The pbit devices 202 are connected through interconnection strengths or weights 204 (J). In the example shown, the interconnection strength 204A between the pbit devices 202A, 202B is shown as $J_{AB}$, and the interconnection strength 204B between the pbit devices 202B, 202C is shown as $J_{BC}$. Although not labeled in FIG. 2A, the other pbit devices have similar interconnection strengths, each of which may be different from one another.

FIG. 2B illustrates a plot 250 of the network energy of the Ising network 200 as a function of the spin state of the network. Overall, the network has an energy E, which depends on the configuration of the spins. The energy E is represented by the equation shown in FIG. 2B, where Jij is the interconnection strength between the i-th and the j-th spin (Si and Sj), and hi is the bias strength. Each spin of the Ising network 200 can be represented in hardware with a ferroelectric-based pbit device, such as those shown and described herein. The example Ising network 200 follows the Boltzmann distribution, with the highest probability of being in the lowest energy state that encodes the solution of the optimization problem. The output of the Ising network 200 may be read and used as appropriate (e.g., analyzed, used as an input to another problem, etc.).

Figure 3:
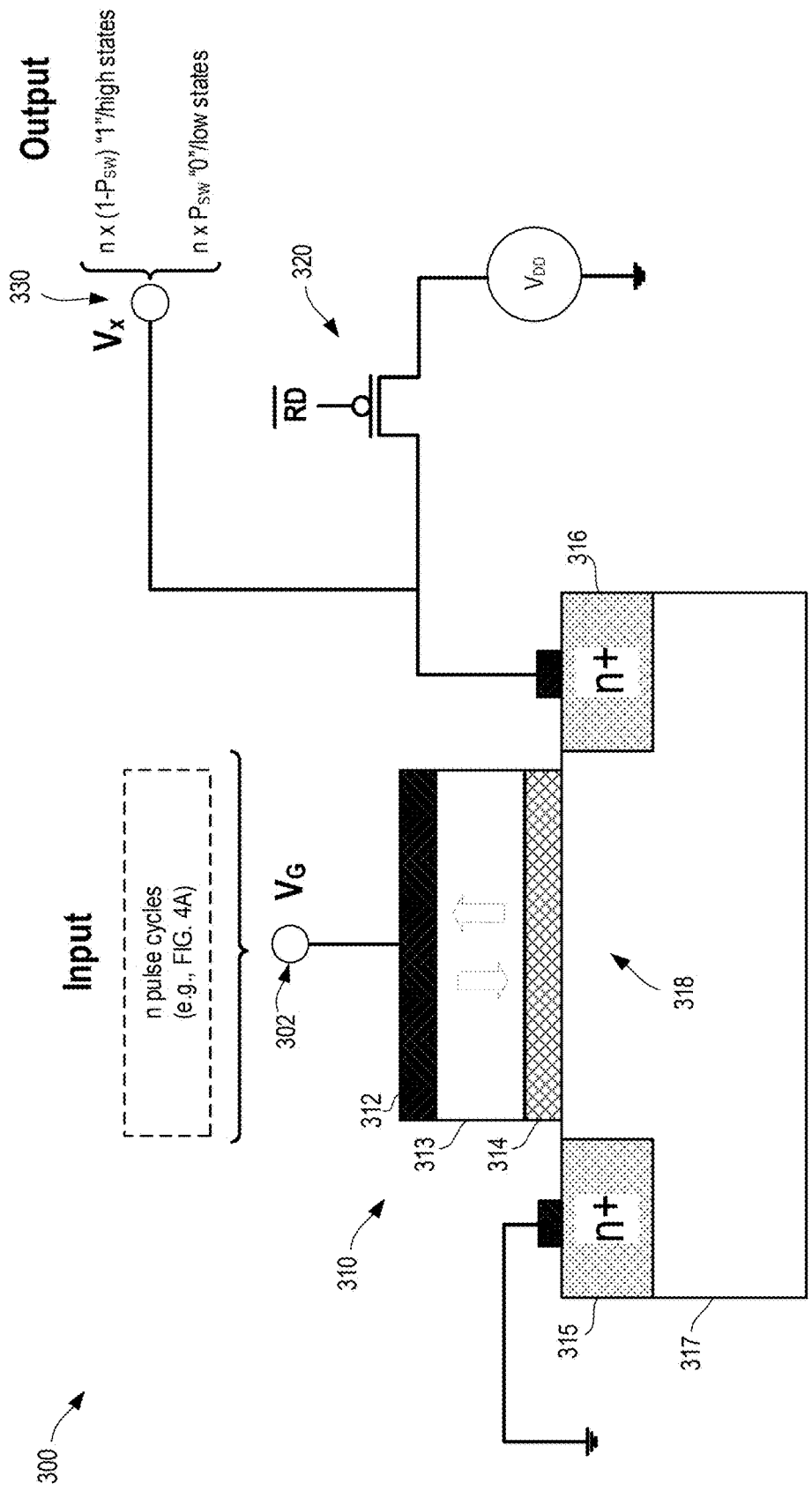
FIG. 3 illustrates an example pbit device comprising an n-channel FeFET in accordance with embodiments of the present disclosure.

FIG. 3 illustrates an example pbit device 300 comprising an n-channel FeFET in accordance with embodiments of the present disclosure. The example pbit device 300 may be used in a hardware computational network, such as an Ising network (e.g., 200 of FIG. 2A), that is used to model a probabilistic algorithm. The example pbit device 300 includes a n-channel FeFET 310 in series with a PMOS transistor 320. The source of the PMOS transistor 320 is connected to a supply voltage $V_{DD}$ and the drain of the PMOS transistor is connected to the drain of the n-channel FeFET 310. The source of the n-channel FeFET 310 is connected to ground. The gate of the PMOS transistor 320 is connected to the opposite of a read (RD) clock signal (i.e., RD_bar). The RD clock signal may be a logic 1 signal when a read pulse is active, as described below.

The example n-channel FeFET 310 includes n-doped source/drain regions 315/316 in a substrate 317 (which may be p-doped in some instances), with electrodes formed on each source/drain region. The FeFET 310 further includes a dielectric layer 314 formed over a channel region 318 of the FeFET 310, a FE material 313 formed on the dielectric layer 314 and a gate electrode layer 312 formed on the FE material 313. The dielectric layer 314 may include any suitable dielectric material as described below, which in some instances, may include silicon and oxygen (e.g., silicon oxide (e.g., $SiO_2$)). The FE material 313 may include, in some instances, hafnium and oxygen (e.g., hafnium oxide (e.g., $HfO_2$)). The gate electrode layer 312 may include one or more metal-based layers, which may include one or more of polycrystalline silicon (Poly-Si), titanium, or nitrogen (e.g., a TiN layer and/or a Poly-Si layer). Although shown in FIG. 3 as a planar FET, certain embodiments may utilize non-planar FETs.

Figure 4A:
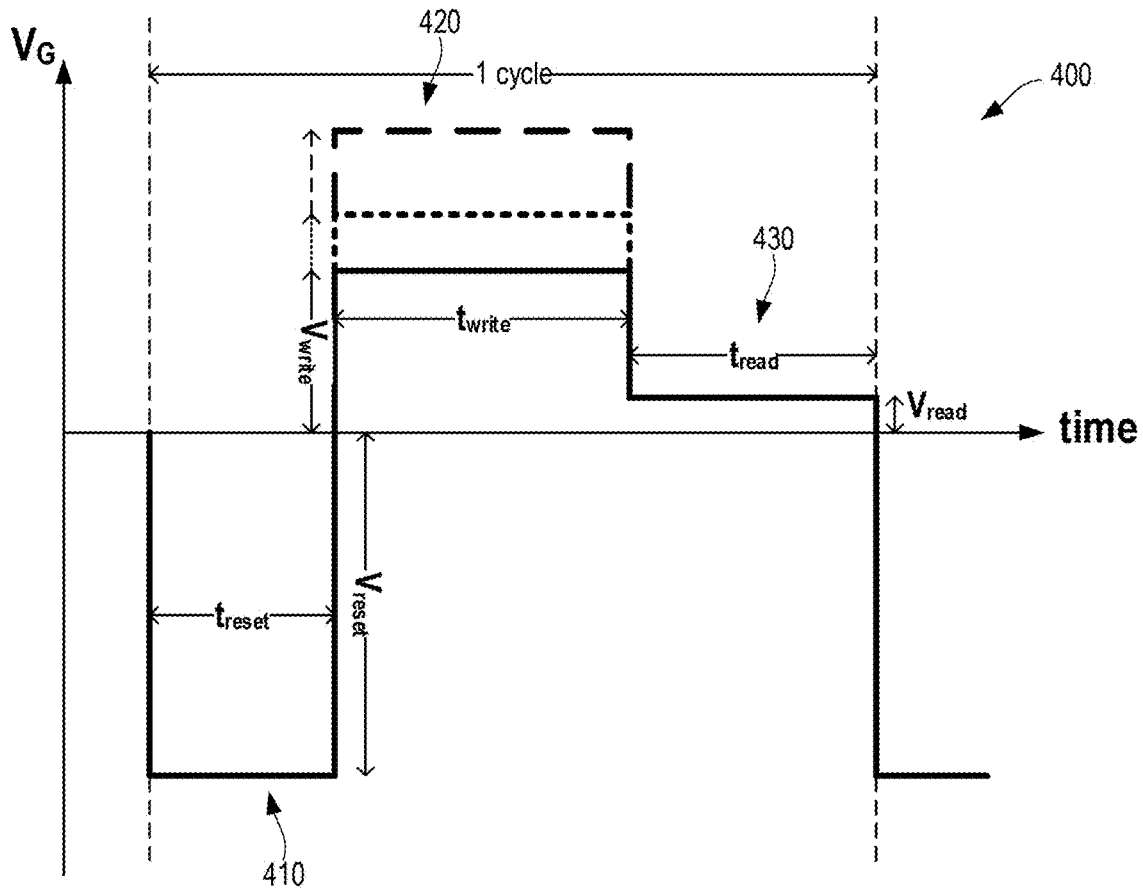
FIG. 4A illustrates an example pulse cycle that may be applied as input to a FeFET-based pbit device in accordance with embodiments of the present disclosure.
Figure 4B:
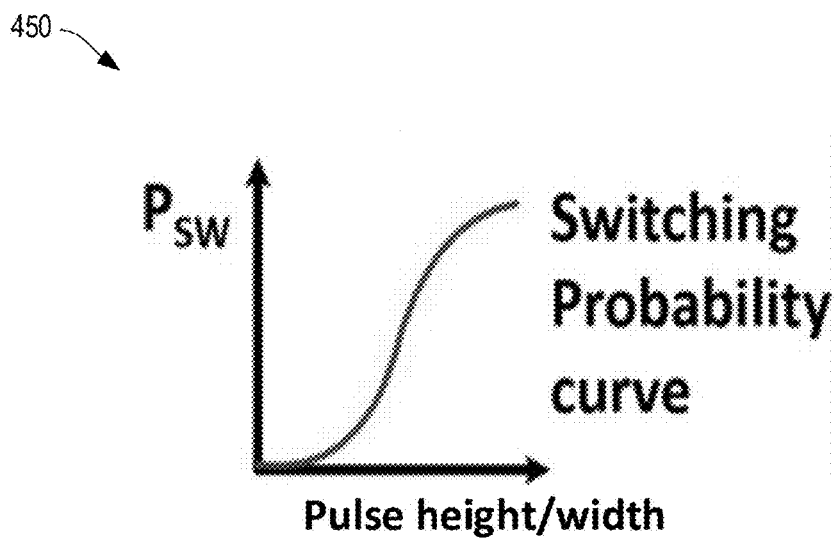
FIG. 4B illustrates an example FE switching probability for a FeFET-based pbit device as a function of input pulse width or height.

To operate the example pbit device 300, a series of n pulse cycles may be applied as input to node 302 ($V_G$) coupled to the gate electrode 312. Each pulse cycle may be configured as shown in FIG. 4A and described further below, including a reset pulse, write pulse, and read pulse. The switching probability $P_{SW}$ of the ferroelectric polarization of the FE material 313 in the FeFET 310 may be a function of write pulse height or width, as shown in FIG. 4B. Based on the switching probability $P_{SW}$, the output $V_X$ may be low or "0" state with a probability of ($n \times P_{SW}$) and high or "1" state with a probability of ($n \times (1-P_{SW})$) as shown.

The FE material 313 may be polarized based on the following phenomenon. When an external electric field is applied across a ferroelectric (FE) film in a direction opposite its polarization, some FE domains reverse their polarization to form a critical nucleus, which then leads to the polarization switching of the entire FE film due to domain growth. The initial domain nucleation step behaves as a Poisson process and leads to the inherent stochasticity of the FE polarization switching. As the area of the FE film is scaled, this switching becomes discrete, eventually becoming a binary event where the FE polarization points either "up" or "down" with a probability that is dependent on the applied field. Thus, the polarization of the FE material 313 within the FeFET may be used to indicate a binary state/spin of the pbit device 300.

FIG. 4A illustrates an example pulse cycle 400 that may be applied as input to a FeFET-based pbit device (e.g., the pbit device 300 of FIG. 3) in accordance with embodiments of the present disclosure. The example pulse cycle 400 includes a reset pulse 410 (negative in this example, which is for the n-channel FeFET 310 of FIG. 3), a write pulse 420 (positive in this example for the n-channel FeFET 310 of FIG. 3), and a read pulse 430 (also positive in this example for the n-channel FeFET 310 of FIG. 3). The reset pulse 410 may be relatively large so that it deterministically sets the polarization of the FE material of the FeFET (e.g., 313). For instance, referring to the example FeFET 310 of FIG. 3, after the reset pulse 410, the FE polarization will be forced to the positive direction (pointing up in FIG. 3).

During the write pulse 420, the FE polarization may switch from positive to negative (pointing down in the example shown in FIG. 3) with a probability that is determined by the height or the width of the write pulse 420. The direction of the FE polarization sets the $V_T$ of the FeFET. In certain embodiments, e.g., as described further below, the magnitude or the width of the write pulse 420 may be based on outputs of other FeFET-based pbit devices.

During the read pulse 430, the RD_bar signal will be input to the PMOS transistor 320. Thus, depending upon the $V_T$ of FeFET (which is determined probabilistically from the write pulse 420), the read pulse 430 will cause the voltage at the output node (e.g., Vx at output node 330 in FIG. 3) will be either pulled to $V_{DD}$ (which may be considered as the −1/down state of the pbit) or ground (which may be considered as the +1/up state of the pbit). Thus, in certain embodiments the magnitude of the read pulse 430 may be set to be a voltage that is between the high $V_T$ and low $V_T$ of the FeFET.

Figure 5:
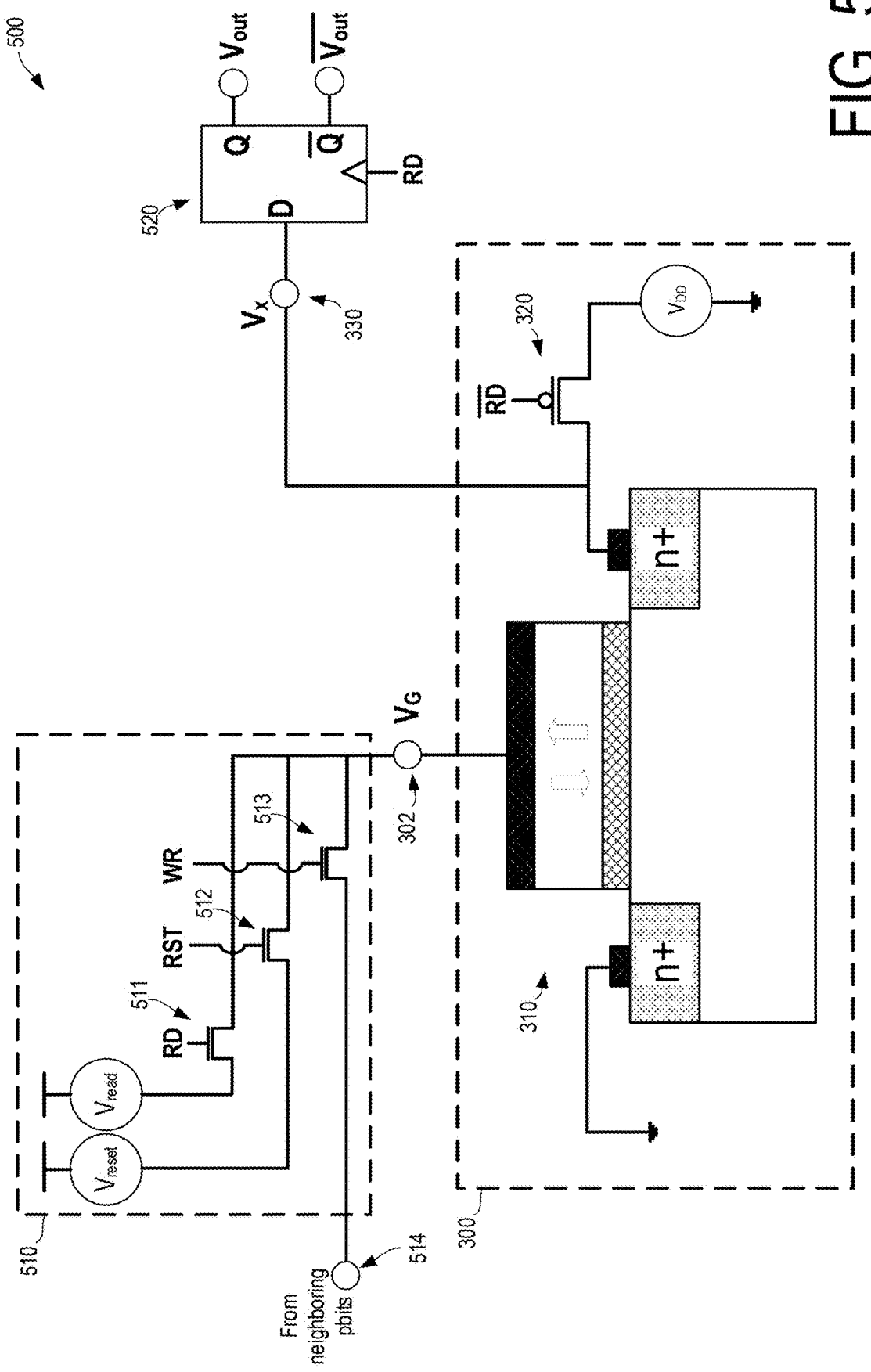
FIG. 5 illustrates another example FeFET-based pbit device that includes the device of FIG. 3.
Figure 6:
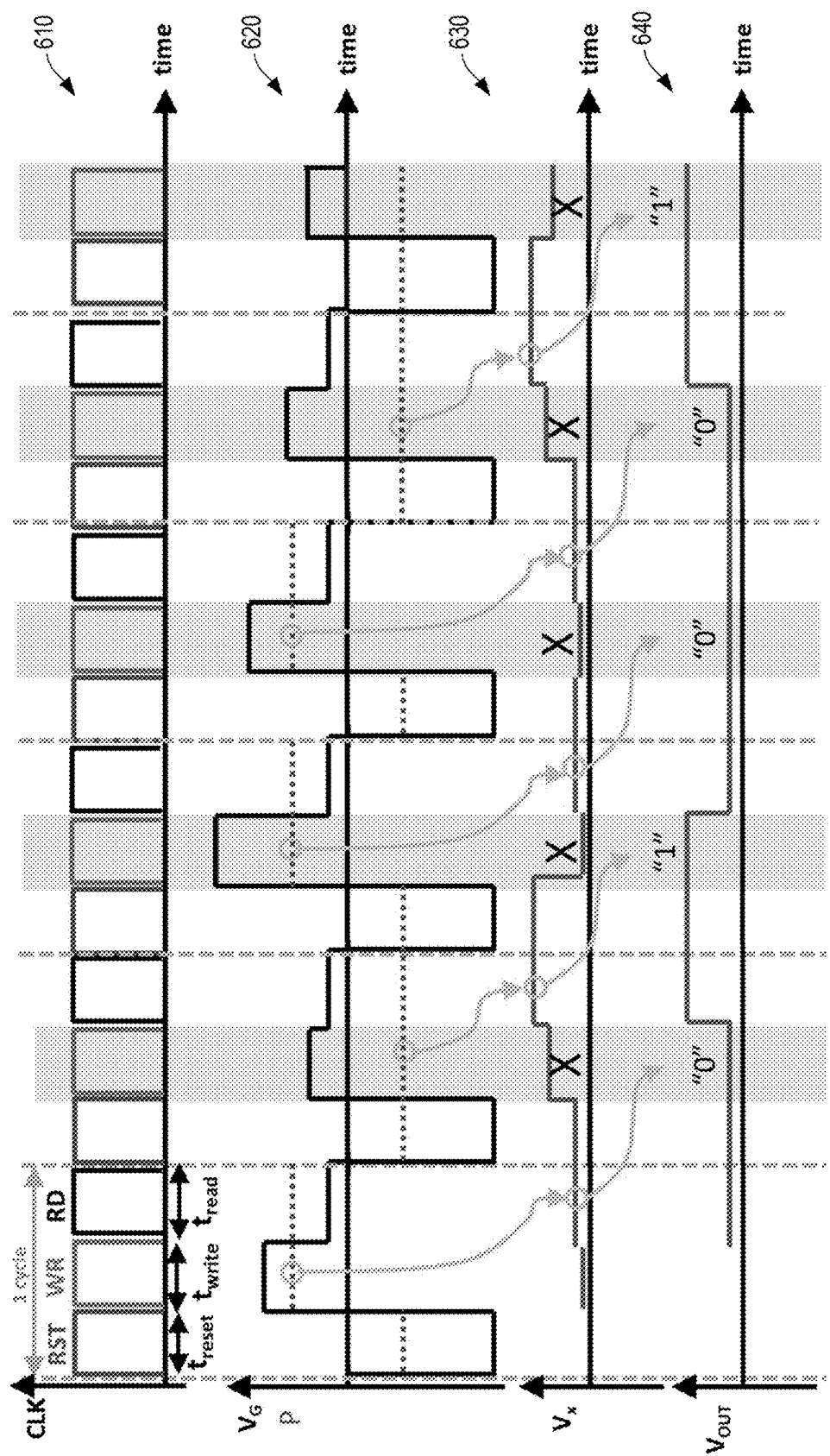
FIG. 6 illustrates an example timing diagram for the FeFET-based pbit device of FIG. 5 in accordance with embodiments of the present disclosure.
Figure 9:
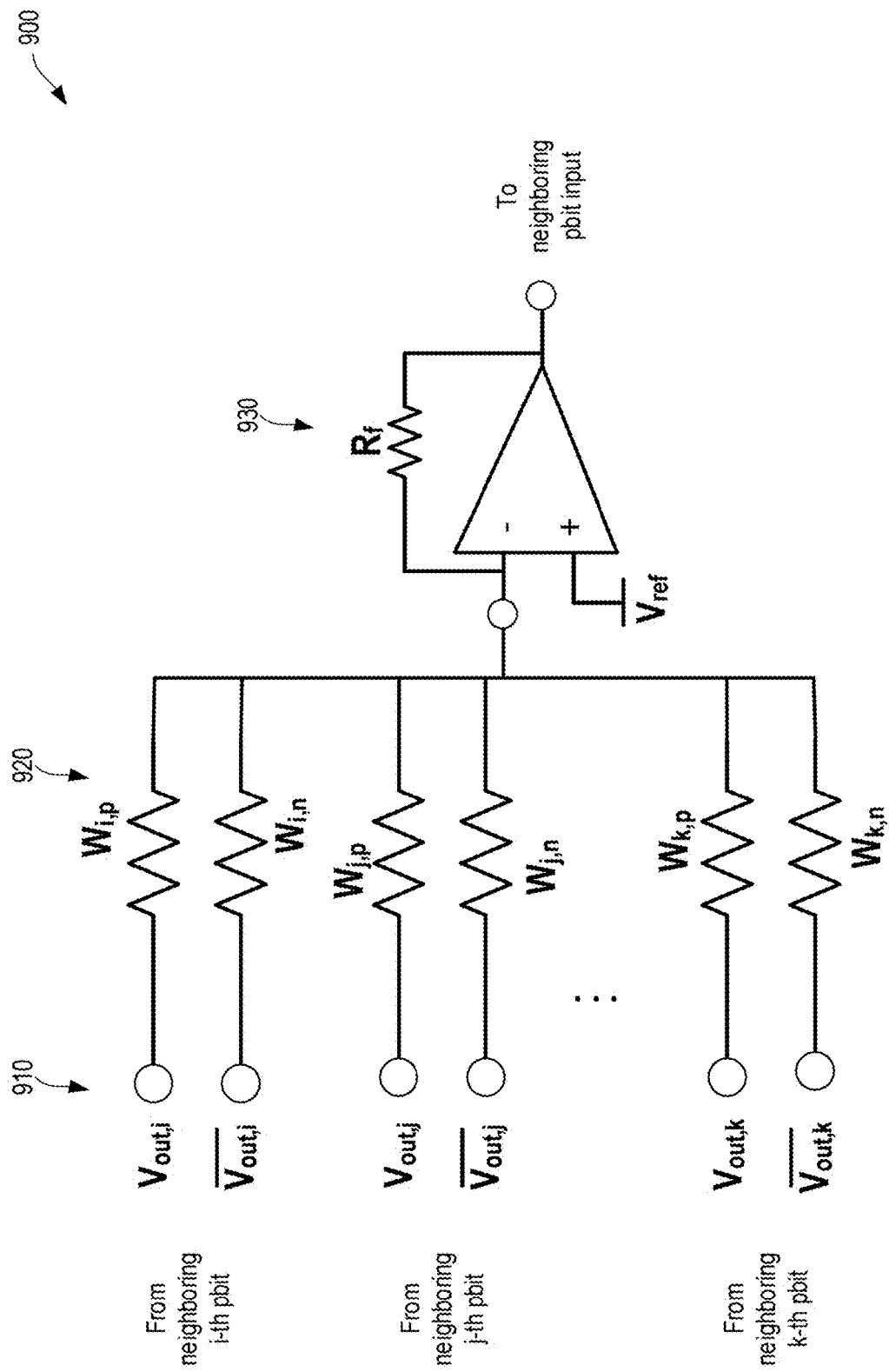
FIG. 9 illustrates an example resistive circuit for connecting neighboring pbit devices of a computational network in accordance with embodiments of the present disclosure.
Figure 10:
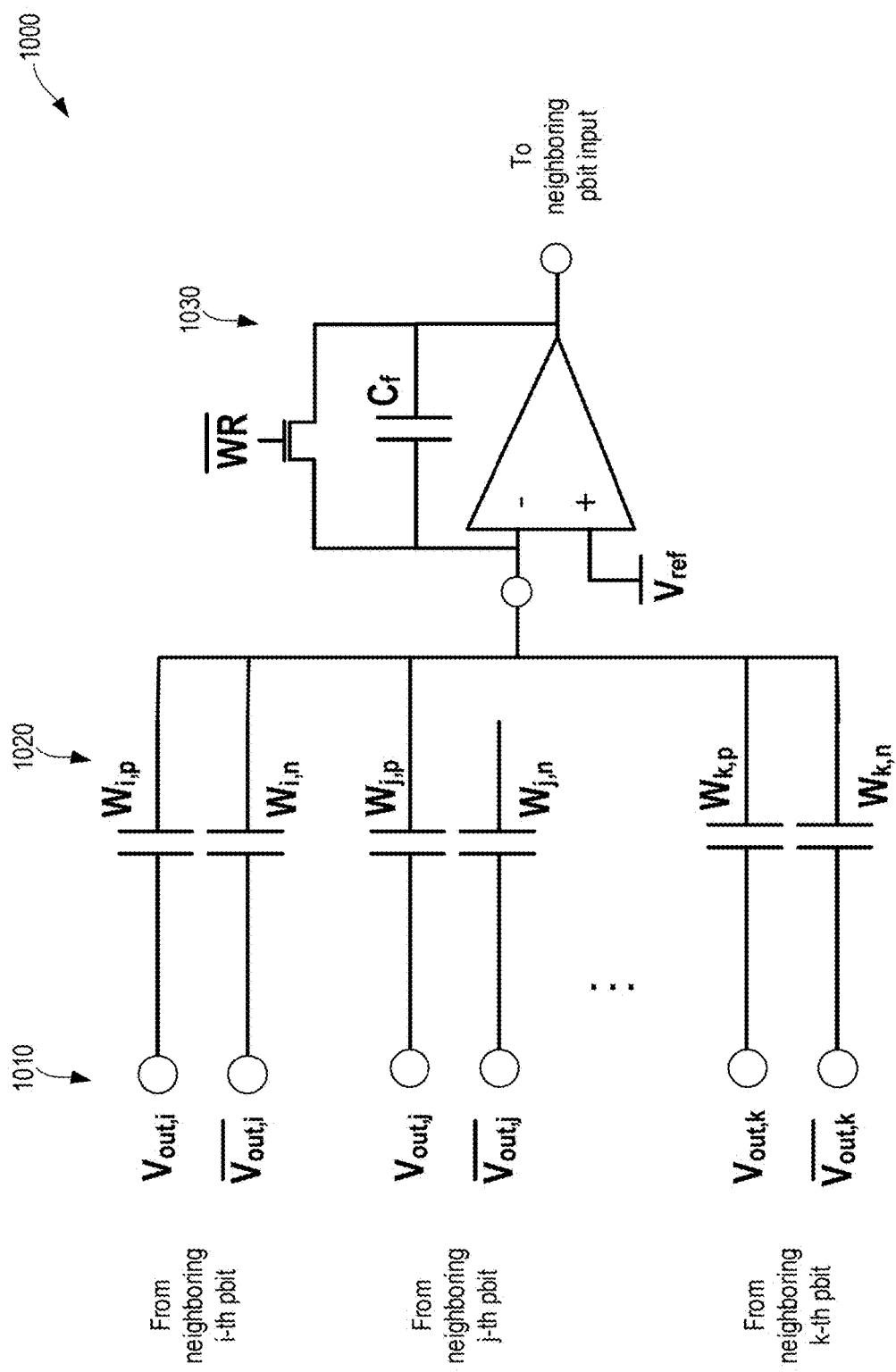
FIG. 10 illustrates an example capacitive circuit for connecting neighboring pbit devices of a computational network in accordance with embodiments of the present disclosure.

FIG. 5 illustrates another example FeFET-based pbit device 500 that includes the device 300 of FIG. 3. In the example shown, the input node 302 of the pbit device 300 is coupled to a pulse generation circuit 510, and the output node 330 of the pbit device 300 is coupled to a D flip-flop circuit 520. The example pulse generation circuit 510 includes a first NMOS transistor 511 whose gate is connected to a read (RD) clock signal, drain is connected to a $V_{read}$ voltage source, and source is connected to the input node 302, a second NMOS transistor 512 whose gate is connected to a reset (RST) clock signal, drain is connected to a $V_{reset}$ voltage source, and source is connected to the input node 302, and a third NMOS transistor 513 whose gate is connected to a write (WR) clock signal, drain is connected to an output node 514 for of one or more neighboring pbit devices (e.g., in an Ising network), and source is connected to the input node 302. The RD, RST, and WR clock signals may be implemented at different times from one another, e.g., in the manner shown in FIG. 6 and described further below. Further, the example D flip-flop circuit 520 may take the voltage $V_X$ at node 330 and generate a logic 1/0 output voltage $V_{out}$ (and it's opposite $V_{out\_bar}$), e.g., as shown in FIG. 6 and described further below. Example connections to multiple neighboring pbit devices for node 514 are shown in FIGS. 9-10 and described further below. It will be understood that the pulse generation circuit 510 may be used to provide the respective pulses to multiple pbit devices (rather than just the one as shown in FIG. 5), e.g., in computational networks (e.g., Ising networks) that include multiple pbit devices as described herein.

FIG. 6 illustrates an example timing diagram for the FeFET-based pbit device 500 of FIG. 5 in accordance with embodiments of the present disclosure. The example timing diagram includes a chart 610 showing the RD, RST, and WR clock signals, a chart 620 showing the voltage at the input node 302 ($V_G$) of the pbit device 300, a chart 630 showing the voltage at the output node 330 ($V_X$) of the pbit device 300, and a chart 640 showing the logic signal voltage ($V_{out}$) produced by the D flip-flop circuit 520 based on the voltage at the output node 330.

In the example shown in FIG. 6, there are 5 full cycles (e.g., the n cycles described above) and ⅔ of a $6^{th}$ cycle illustrated. In each cycle, the RST clock signal (a logic 1 signal) is activated for a $t_{reset}$ period, followed by the WR clock signal (a logic 1 signal) for a $t_{write}$ period, and then followed by the RD clock signal (a logic 1 signal) for a $t_{read}$ period. During the $t_{reset}$ period of each cycle, a large negative voltage is applied at the node 302 to deterministically set the polarization of the FE material of the FeFET 310 (shown in FIG. 6 by the dotted line, P).

During the $t_{write}$ period, a voltage $V_{write}$ is applied at the node 302. The $V_{write}$ voltage may be based on one or more outputs of neighboring pbit devices in a probabilistic modeling computational network, such as an Ising network. In some instances, the voltage may be a weighted sum of neighboring output voltage, e.g., generated through one of the summing circuits described further below with respect to FIGS. 9-10. Due to the probabilistic nature of the pbit network, the $V_{write}$ voltage may vary each cycle, as shown in FIG. 6. Depending on the $V_{write}$ voltage applied during the $t_{write}$ period, the polarization of the FE material within the FeFET may flip or not from the polarization set by the reset pulse. For instance, in the first cycle shown in FIG. 6, the voltage applied during the $t_{write}$ period is large enough to flip the polarization; in contrast, the voltage applied during the $t_{write}$ period of the second cycle shown in FIG. 6 is not large enough to flip the polarization.

Next, during the $t_{read}$ period, a particular voltage $V_{read}$ is applied to the node 302 to determine the polarization of the FeFET 310. The voltage $V_{read}$ may be between the high and low threshold voltages that are inherent to the FeFET, and are based on the state of the polarization of the FE material in the FeFET. The voltage $V_{read}$ may cause the voltage at the node 330 ($V_X$) to stay low, e.g., when the polarization is flipped, or to go high, e.g., when the polarization is not flipped. Based on this, the voltage $V_{out}$ may change. However, the reading of $V_{out}$ during the tread may be delayed by one cycle due to the D flip-flop circuit 520. That is, the reading of the $V_{out}$ in an n-th cycle may represent the state written to the pbit device in the (n−1)-th cycle. In the example shown, a positive polarization (caused by a higher magnitude positive $V_G$) is considered as a logic 0 signal while a negative polarization (caused by a lower magnitude positive $V_G$) is considered as a logic 1 signal.

For example, in the first cycle shown in FIG. 6, the polarization is flipped during the $t_{write}$ period, which causes the voltage $V_x$ to stay relatively low in the first cycle. This low $V_x$ state, however, is captured in the second cycle shown during the $t_{read}$ period as shown in FIG. 6. Likewise, in the second cycle shown in FIG. 6, the polarization is not flipped during the $t_{write}$ period, which causes the voltage $V_x$ to go relatively high in the second cycle. This higher $V_x$ state is captured in the third cycle shown during the $t_{read}$ period as shown in FIG. 6.

Figure 7:
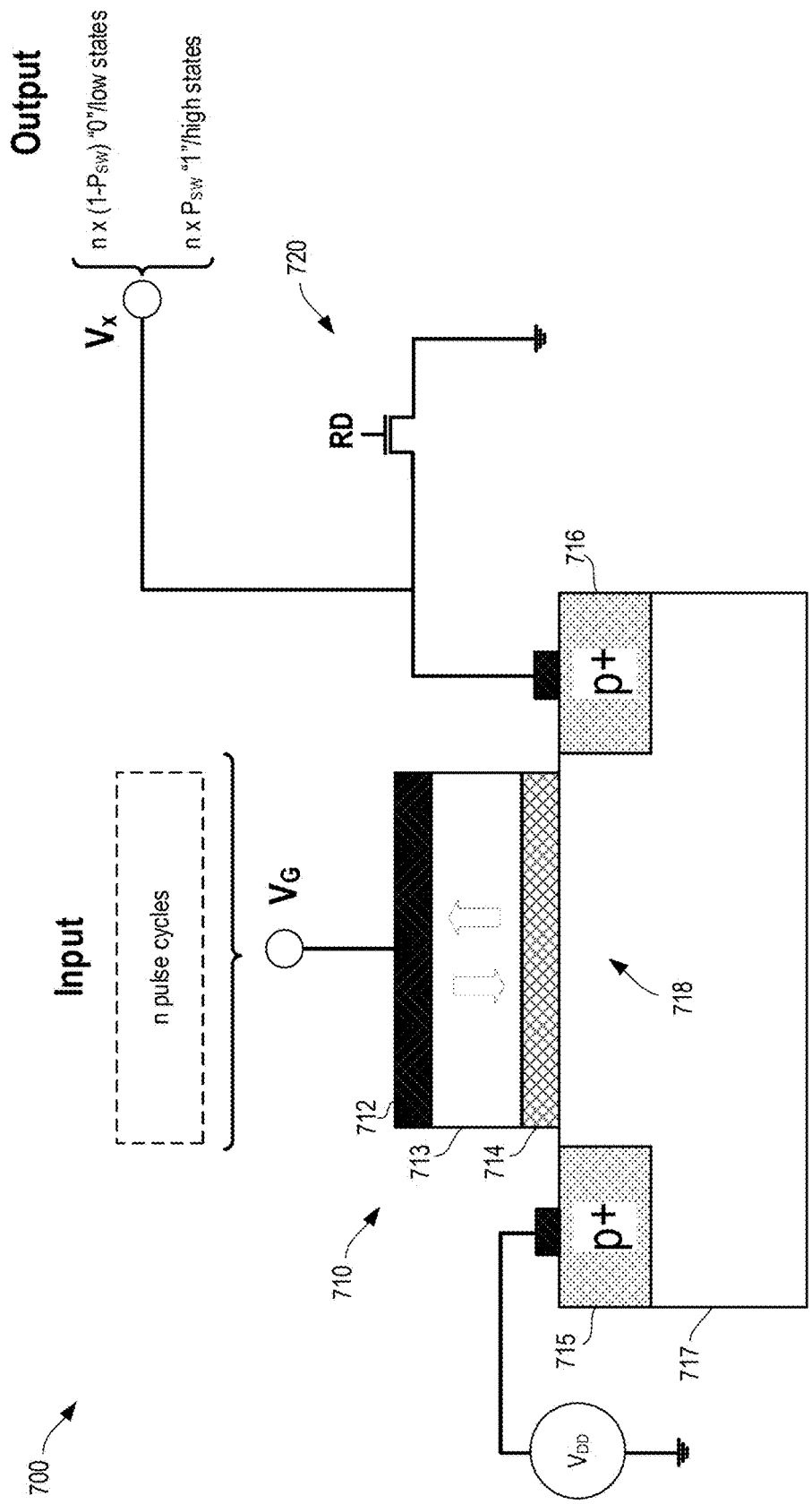
FIG. 7 illustrates an example pbit device comprising a p-channel FeFET in accordance with embodiments of the present disclosure.

FIG. 7 illustrates an example pbit device 700 comprising a p-channel FeFET in accordance with embodiments of the present disclosure. The example pbit device 700 may be used in a hardware computational network, such as an Ising network (e.g., 200 of FIG. 2A), that is used to model a probabilistic algorithm. The example pbit device 700 includes a p-channel FeFET 710 in series with a NMOS transistor 720. The source of the NMOS transistor 720 is connected to ground while the drain of the NMOS transistor is connected to the drain of the p-channel FeFET 710. The source of the p-channel FeFET 310 is connected to the supply voltage $V_{DD}$. The gate of the NMOS transistor 720 is connected to the read (RD) clock signal, which is described above.

The example p-channel FeFET 710 includes p-doped source/drain regions 715/716 in a substrate 717 (which may be n-doped in some instances), with electrodes formed on each source/drain region. The FeFET 710 further includes a dielectric layer 714 formed over a channel region 718 of the FeFET 710, a FE material 713 formed on the dielectric layer 714 and a gate electrode layer 712 formed on the FE material 713. The dielectric layer 714 may include any suitable dielectric material as described below, which in some instances, may include silicon and oxygen (e.g., silicon oxide (e.g., $SiO_2$)). The FE material 713 may include, in some instances, hafnium and oxygen (e.g., hafnium oxide (e.g., $HfO_2$)). The gate electrode layer 712 may include one or more metal-based layers, which may include one or more of polycrystalline silicon (Poly-Si), titanium, or nitrogen (e.g., a TiN layer and/or a Poly-Si layer). Although shown in FIG. 7 as a planar FET, certain embodiments may utilize non-planar FETs.

The example pbit device 700 may be operated in similar manner to the pbit device 300 of FIG. 3, but with input/output voltages of opposite polarity. For instance, the input n cycles may be similar to those shown in FIG. 4A, but with opposite polarity. That is, the reset pulse may be a highly positive voltage pulse to deterministically set the polarization of the FE material 713, and the write pulse and read may be negative voltages of smaller magnitude than the reset pulse. The switching probability $P_{SW}$ of the ferroelectric polarization of the FE material 713 in the FeFET 710 may also be a function of write pulse height or width. Based on the switching probability $P_{SW}$, the output $V_X$ may be low/"0" state with a probability of $(n \times (1-P_{SW}))$ and high/"1" with a probability of $(n \times P_{SW})$ as shown.

Figure 8:
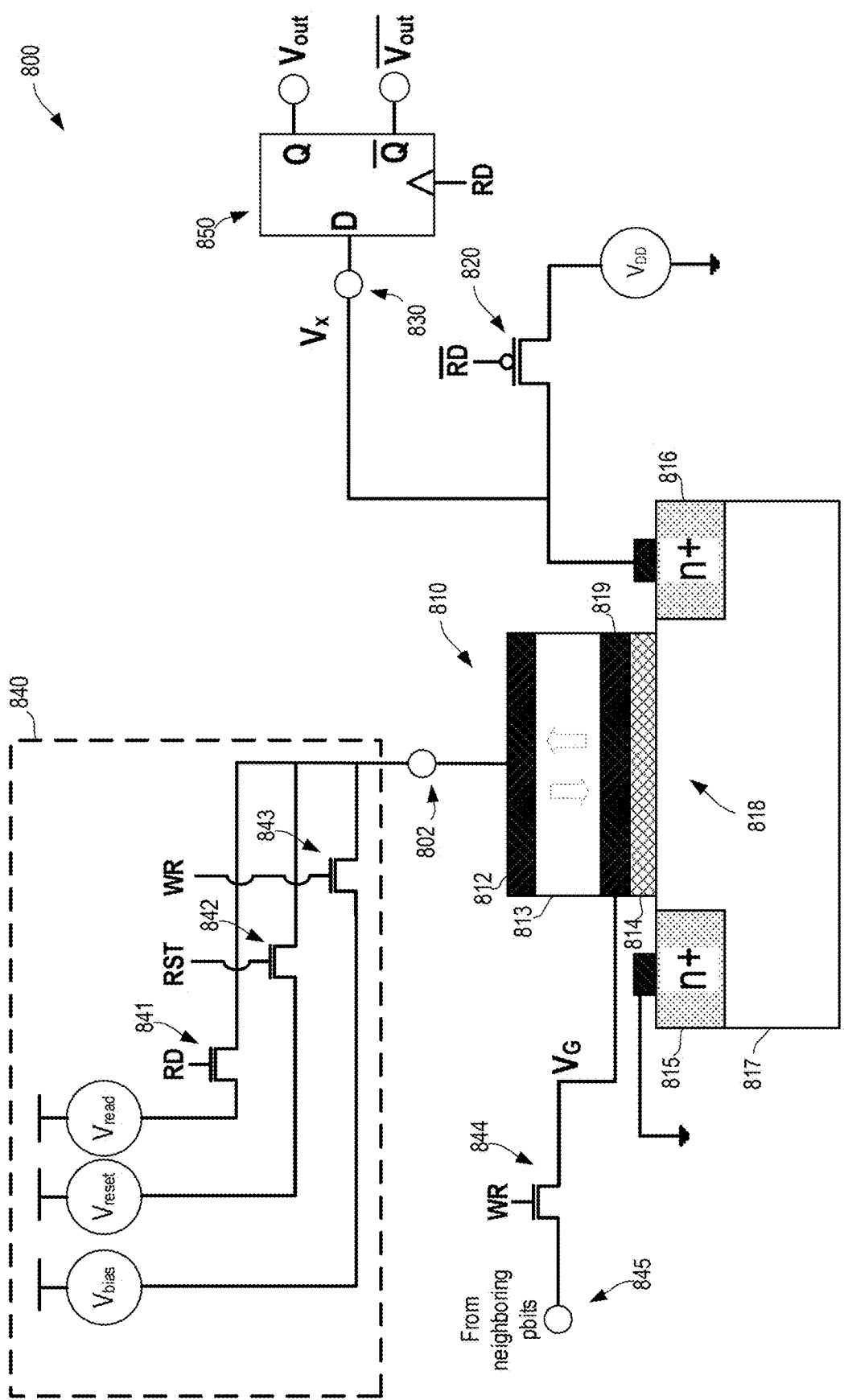
FIG. 8 illustrates another example pbit device comprising an n-channel FeFET in accordance with embodiments of the present disclosure.

FIG. 8 illustrates another example pbit device 800 comprising an n-channel FeFET 810 in accordance with embodiments of the present disclosure. The example pbit device 800 may be used in a hardware network, such as an Ising network (e.g., 200 of FIG. 2A), that is used to model a probabilistic algorithm. The example pbit device 800 includes a n-channel FeFET 810 in series with a PMOS transistor 820. The source of the PMOS transistor 820 is connected to a supply voltage $V_{DD}$ and the drain of the PMOS transistor is connected to the drain of the n-channel FeFET 810. The source of the n-channel FeFET 810 is connected to ground. The gate of the PMOS transistor 820 is connected to the opposite of a read (RD) clock signal (i.e., RD_bar). The RD clock signal may be a logic 1 signal when a read pulse is active, as described above.

The example n-channel FeFET 810 includes n-doped source/drain regions 815/816 in a substrate 817 (which may be p-doped in some instances), with electrodes formed on each source/drain region. The FeFET 810 further includes a dielectric layer 814 formed over a channel region 818 of the FeFET 810, a first electrode layer 819 formed on the dielectric layer 814, a FE material 813 formed on the first electrode layer 819, and a second electrode layer 812 formed on the FE material 813. The dielectric layer 814 may include any suitable dielectric material as described below, which in some instances, may include silicon and oxygen (e.g., silicon oxide (e.g., $SiO_2$)). The FE material 813 may include, in some instances, hafnium and oxygen (e.g., hafnium oxide (e.g., $HfO_2$)). The first or second electrode layer 812 may include one or more metal-based layers, which may include one or more of polycrystalline silicon (Poly-Si), titanium, or nitrogen (e.g., a TiN layer and/or a Poly-Si layer). Although shown in FIG. 8 as a planar FET, certain embodiments may utilize non-planar FETs.

The input node 802 of the pbit device 800 is coupled to a pulse generation circuit 840, and the output node 830 of the pbit device 800 is coupled to a D flip-flop circuit 850. The example pulse generation circuit 840 includes a first NMOS transistor 841 whose gate is connected to a read (RD) clock signal, drain is connected to a $V_{read}$ voltage source, and source is connected to the input node 802, a second NMOS transistor 842 whose gate is connected to a reset (RST) clock signal, drain is connected to a $V_{reset}$ voltage source, and source is connected to the input node 802, and a third NMOS transistor 843 whose gate is connected to a write (WR) clock signal, drain is connected to a $V_{bias}$ voltage source, and source is connected to the input node 802. The first electrode layer 819 is connected to an output node 845 for of one or more neighboring pbit devices (e.g., in an Ising network) through a fourth NMOS transistor 844 whose gate is connected to the WR clock signal. By only applying a voltage to the first electrode layer 819 during the write phase (when the WR signal is active), the first electrode layer 819 may be floated during the read and reset phases. The RD, RST, and WR clock signals may be implemented at different times from one another, e.g., in the manner shown in FIG. 6 and described above. As above, the example D flip-flop circuit 850 may take the voltage $V_X$ at node 830 and generate a logic 1/0 output voltage $V_{out}$ (and it's opposite $V_{out\_bar}$), e.g., as shown in FIG. 6 and described above. Example connections to multiple neighboring pbit devices for node 845 are shown in FIGS. 9-10 and described further below. It will be understood that the pulse generation circuit 840 may be used to provide the respective pulses to multiple pbit devices (rather than just the one as shown in FIG. 8), e.g., in computational networks (e.g., Ising networks) that include multiple pbit devices as described herein.

The example pbit device 800 works in a similar manner to the pbit devices discussed above. However, in the example shown, the probability of the FE polarization switching in the FE material 813 is controlled through the voltage applied to the first electrode layer 819. Therefore, in the input voltage sequence, a write pulse height and width are kept constant based on the $V_{bias}$ voltage applied at 802, and the voltage at 845 (which is based on the voltage of neighboring nodes in a network such as an Ising network) determines the overall voltage drop across the FE material layer 813 and accordingly controls the probability of the FE switching. Therefore, the pulse generation circuitry 840 of the pbit device 800 may be made slightly simpler compared to the pulse generation circuitry 510 of the pbit device 500. In addition, one advantage of the pbit device 800 is that having a symmetric metal/FE/metal stack in 812/813/819 may improve the endurance of the gate stack.

FIG. 9 illustrates an example resistive circuit 900 for connecting neighboring pbit devices of a computational network in accordance with embodiments of the present disclosure. In the example shown, outputs 910 from a set of pbit devices (e.g., from the D flip-flop circuit 520 of FIG. 5 or the D flip-flop circuit 850 of FIG. 8) are weighted and summed using a resistive array 920 (e.g., memristive crossbar or multi-level MRAM array with reconfigurable resistance values), and the summing amplifier circuit 930, and provided as the input to the next neighboring pbit device (e.g., at node 514 of the pbit device 500 of FIG. 5 or node 845 of the pbit device 800 of FIG. 8).

The values of the resistors in the array 920 may be adjusted to apply different weights to the outputs of the neighboring pbit devices. In the example shown, there are different resistors connected to the respective outputs of the D flip-flop circuits of the neighboring pbit devices. The values of these (e.g., $w_{i,p}$ and $w_{i,n}$) may be different from one another. For instance, one of the resistor values may be infinite (or effectively infinite) where only one of the up/down output voltage signals is to be summed by the circuit 930. The $w_{i,p}$ value may apply a weight to the up output, while the $w_{i,n}$ value may apply a weight to the down output. The summing amplifier circuit 930 includes an opamp in a negative feedback configuration, with a reference voltage applied at the positive input of the opamp. The reference voltage $V_{ref}$ may be a voltage that is between the supply voltage $V_{DD}$ and ground (e.g., $V_{DD}/2$). The summing amplifier circuit 930 may effectively sum the currents provided at the input node and provide a corresponding output voltage.

FIG. 10 illustrates an example capacitive circuit 1000 for connecting neighboring pbit devices of a computational network in accordance with embodiments of the present disclosure. In the example shown, outputs 1010 from a set of pbit devices (e.g., from the D flip-flop circuit 520 of FIG. 5 or the D flip-flop circuit 850 of FIG. 8) are weighted and summed using a binary weighted array of switch capacitors 1020 and a summing amplifier circuit 1030, and provided as the input to the next neighboring pbit device (e.g., at node 514 of the pbit device 500 of FIG. 5 or node 845 of the pbit device 800 of FIG. 8).

The values of the capacitors in the array 1020 may be adjusted to apply different weights to the outputs of the neighboring pbit devices. In the example shown, there are different capacitors connected to the respective outputs of the D flip-flop circuits of the neighboring pbit devices. The values of these (e.g., $w_{i,p}$ and $w_{i,n}$) may be different from one another. For instance, one of the capacitor values may be zero where only one of the up/down output voltage signals is to be summed by the circuit 1030. The $w_{i,p}$ value may apply a weight to the up output, while the $w_{i,n}$ value may apply a weight to the down output. The summing amplifier circuit 1030 includes an opamp in a negative feedback configuration (with a switched capacitor coupled to the WR_bar clock signal), with a reference voltage applied at the positive input of the opamp. The reference voltage $V_{ref}$ may be a voltage that is between the supply voltage $V_{DD}$ and ground (e.g., $V_{DD}/2$). The summing amplifier circuit 930 may effectively sum the voltages provided at the input node and provide a corresponding output voltage.

Figure 11:
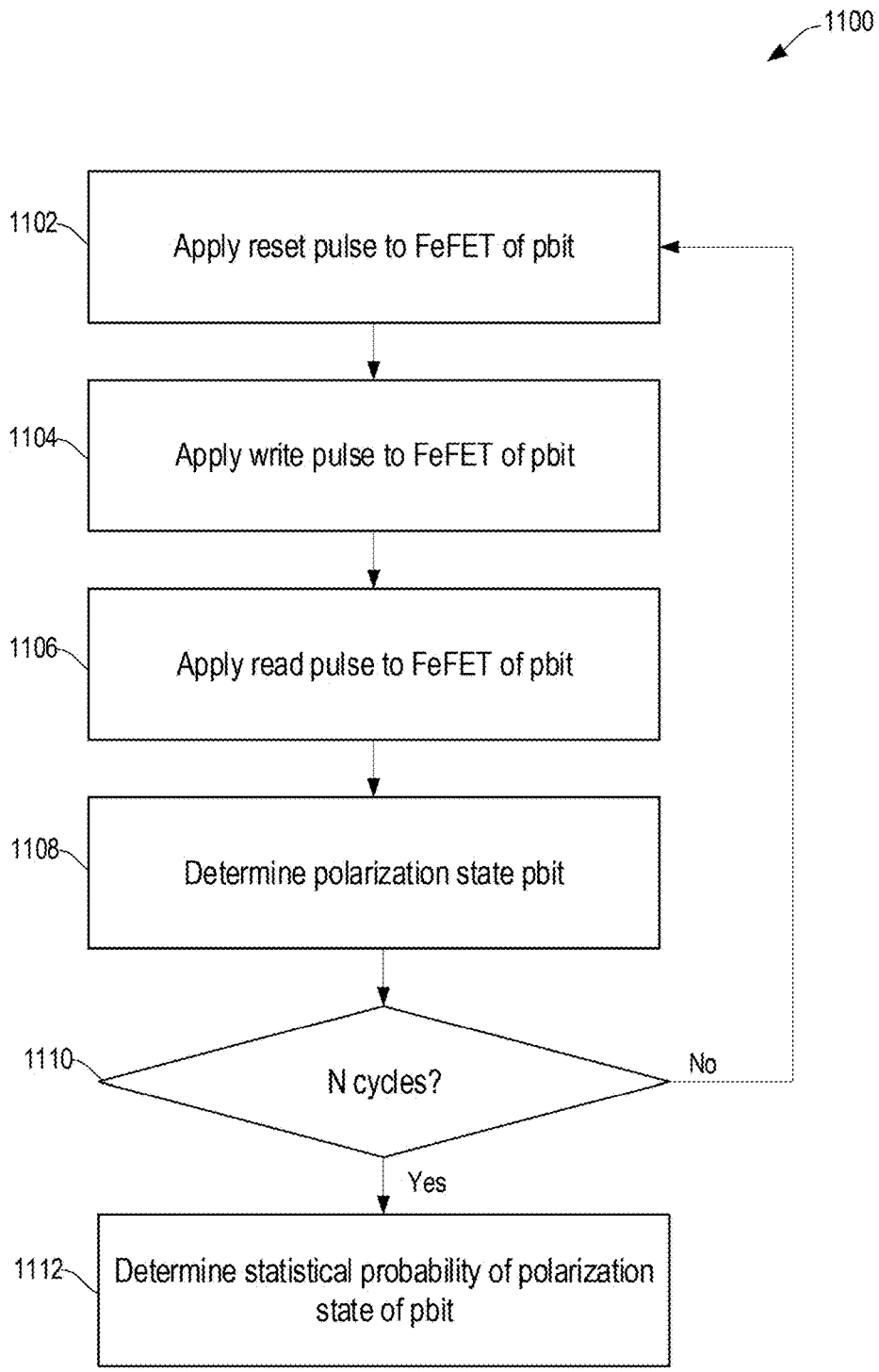
FIG. 11 is a flow diagram illustrating an example process 1100 of operating a FeFET of a pbit device in accordance with embodiments of the present disclosure.

FIG. 11 is a flow diagram illustrating an example process 1100 of operating a FeFET of a pbit device in accordance with embodiments of the present disclosure. The example process may include additional or different operations, and the operations may be performed in the order shown or in another order. In some cases, one or more of the operations shown in FIG. 11 are implemented as processes that include multiple operations, sub-processes, or other types of routines. In some cases, operations can be combined, performed in another order, performed in parallel, iterated, or otherwise repeated or performed another manner.

At 1102, a reset pulse is applied to the FeFET of the pbit device. The reset pulse may be a voltage with a magnitude that deterministically set a polarization state of the FE material layer of the FeFET. At 1104, a write pulse is applied to the FeFET of the pbit device. The write pulse may be a voltage with a magnitude that is based on an output voltage of at least one other FeFET, e.g., FeFETs of other interconnected pbit devices. The output voltages of the other FeFETs may be based on a polarization state of the respective FE material layers of the FeFETs, as described above. At 1106, a read pulse is applied to the FeFET of the pbit device. The read pulse may be a voltage with a magnitude that is between a first threshold voltage of the FET based on a first polarization state of the FE material layer (e.g., positive polarization) and a second threshold voltage of the FET based on a second polarization state of the FE material layer (e.g., negative polarization). At 1108, a polarization state of the pbit device is determined. The polarization state may be determined based on a voltage detected at an output node of the pbit device, e.g., at the voltage at the drain electrode of the FeFET 310 of FIG. 3 ($V_X$).

At 1110, it is determined whether there have been a particular number (N) of pulse cycles applied to the FeFET of the pbit device. If not, the operations 1102, 1104, 1106, and 1008 are performed again. If N pulse cycles have been performed, then at 1112, a statistical probability of the polarization state of the pbit device is determined. The statistical probability may be used to determine a solution of a computational problem, e.g., as described above.

Figure 12:
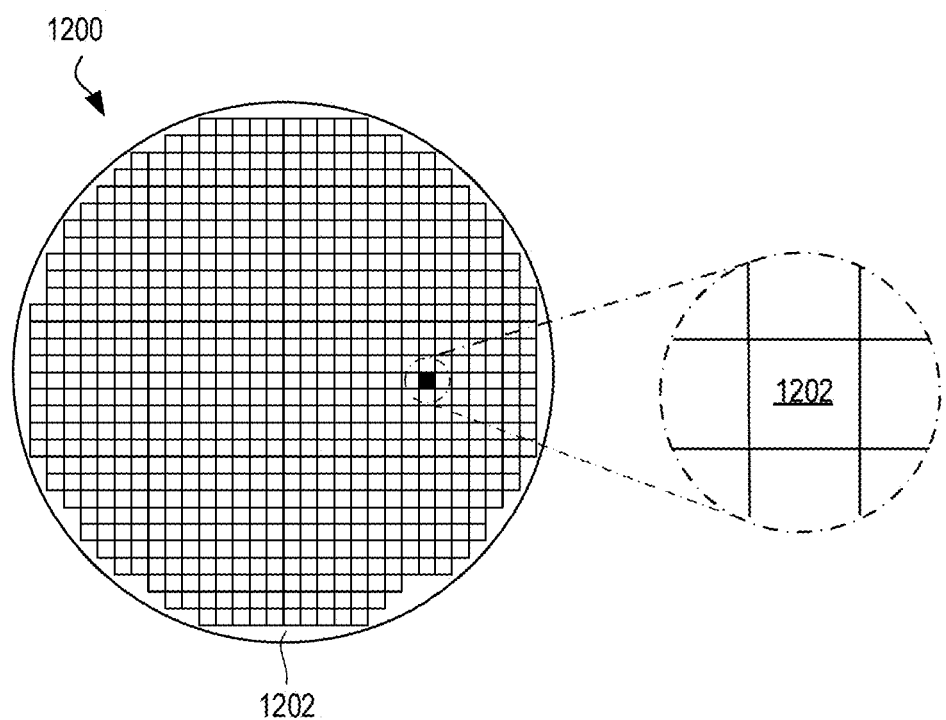
FIG. 12 is a top view of a wafer and dies that may be included in a microelectronic assembly, in accordance with any of the embodiments disclosed herein.

FIG. 12 is a top view of a wafer 1200 and dies 1202 that may include any of the FeFET-based pbit devices disclosed herein. The wafer 1200 may be composed of semiconductor material and may include one or more dies 1202 having integrated circuit structures formed on a surface of the wafer 1200. The individual dies 1202 may be a repeating unit of an integrated circuit product that includes any suitable integrated circuit. After the fabrication of the semiconductor product is complete, the wafer 1200 may undergo a singulation process in which the dies 1202 are separated from one another to provide discrete "chips" of the integrated circuit product. The die 1202 may include one or more transistors (e.g., some of the transistors 1340 of FIG. 13, discussed below), supporting circuitry to route electrical signals to the transistors, passive components (e.g., signal traces, resistors, capacitors, or inductors), and/or any other integrated circuit components. In some embodiments, the wafer 1200 or the die 1202 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1202. For example, a memory array formed by multiple memory devices may be formed on a same die 1202 as a processor unit (e.g., the processor unit 1602 of FIG. 16) or other logic that is configured to store information in the memory devices or execute instructions stored in the memory array. Various ones of the FeFET-based pbit devices disclosed herein may be manufactured using a die-to-wafer assembly technique in which some dies are attached to a wafer 1200 that include others of the dies, and the wafer 1200 is subsequently singulated.

Figure 13:
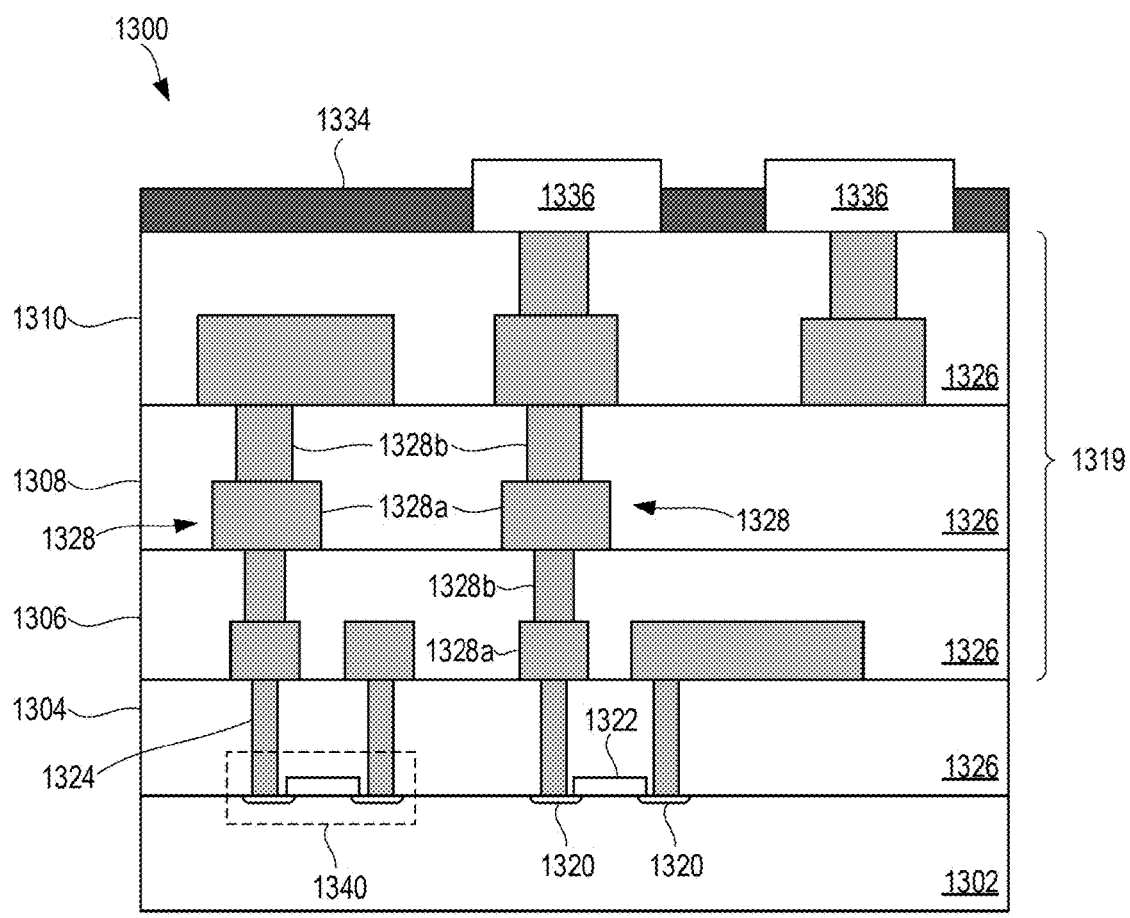
FIG. 13 is a cross-sectional side view of an integrated circuit device that may be included in a microelectronic assembly, in accordance with any of the embodiments disclosed herein.

FIG. 13 is a cross-sectional side view of an integrated circuit device 1300 that may include any of the FeFET-based pbit devices disclosed herein. One or more of the integrated circuit devices 1300 may be included in one or more dies 1202 (FIG. 12). The integrated circuit device 1300 may be formed on a die substrate 1302 (e.g., the wafer 1200 of FIG.

12) and may be included in a die (e.g., the die 1202 of FIG. 12). The die substrate 1302 may be a semiconductor substrate composed of semiconductor material systems including, for example, n-type or p-type materials systems (or a combination of both). The die substrate 1302 may include, for example, a crystalline substrate formed using a bulk silicon or a silicon-on-insulator (SOI) substructure. In some embodiments, the die substrate 1302 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1302. Although a few examples of materials from which the die substrate 1302 may be formed are described here, any material that may serve as a foundation for an integrated circuit device 1300 may be used. The die substrate 1302 may be part of a singulated die (e.g., the dies 1202 of FIG. 12) or a wafer (e.g., the wafer 1200 of FIG. 12).

The integrated circuit device 1300 may include one or more device layers 1304 disposed on the die substrate 1302. The device layer 1304 may include features of one or more transistors 1340 (e.g., metal oxide semiconductor field-effect transistors (MOSFETs)) formed on the die substrate 1302. The transistors 1340 may include, for example, one or more source and/or drain (S/D) regions 1320, a gate 1322 to control current flow between the S/D regions 1320, and one or more S/D contacts 1324 to route electrical signals to/from the S/D regions 1320. The transistors 1340 may include additional features not depicted for the sake of clarity, such as device isolation regions, gate contacts, and the like. The transistors 1340 are not limited to the type and configuration depicted in FIG. 13 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

FIGS. 14A-14D are simplified perspective views of example planar, FinFET, gate-all-around, and stacked gate-all-around transistors. The transistors illustrated in FIGS. 14A-14D are formed on a substrate 1416 having a surface 1408. Isolation regions 1414 separate the source and drain regions of the transistors from other transistors and from a bulk region 1418 of the substrate 1416.

Figure 14B:
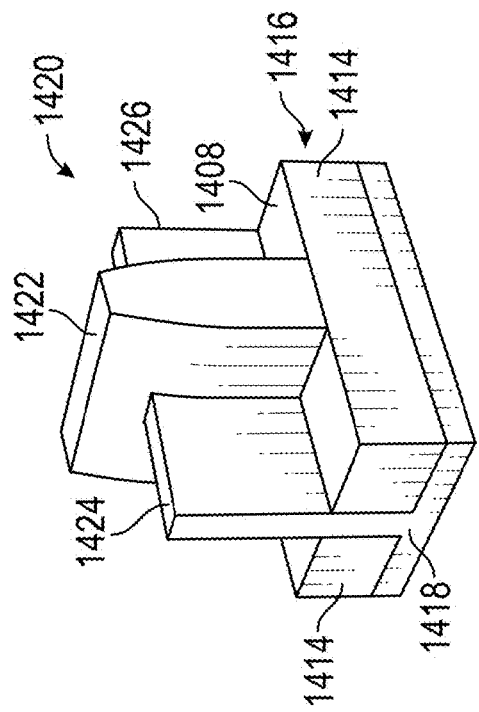
FIGS. 14A-14D are perspective views of example planar, FinFET, gate-all-around, and stacked gate-all-around transistors.
Figure 14D:
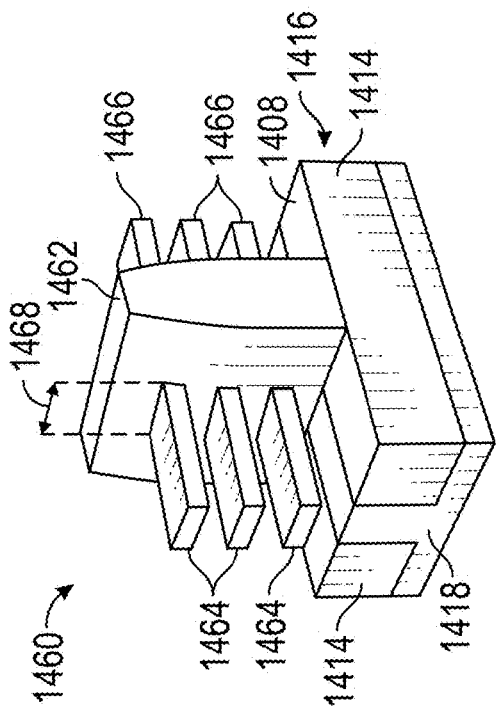
Figure 14A:
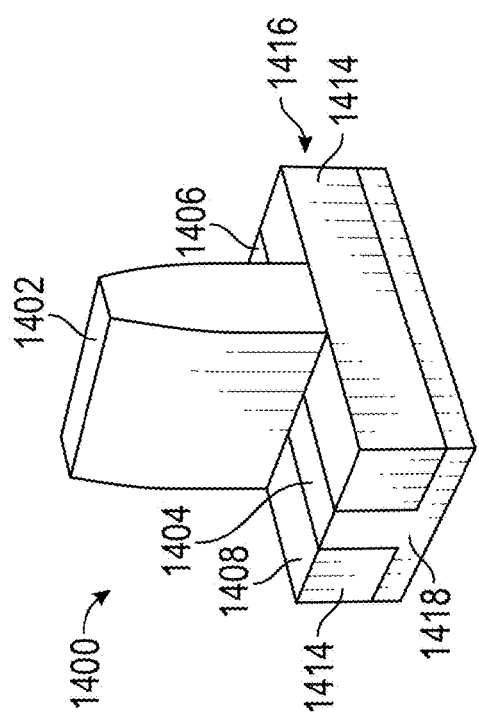

FIG. 14A is a perspective view of an example planar transistor 1400 comprising a gate 1402 that controls current flow between a source region 1404 and a drain region 1406. The transistor 1400 is planar in that the source region 1404 and the drain region 1406 are planar with respect to the substrate surface 1408.

FIG. 14B is a perspective view of an example FinFET transistor 1420 comprising a gate 1422 that controls current flow between a source region 1424 and a drain region 1426. The transistor 1420 is non-planar in that the source region 1424 and the drain region 1426 comprise "fins" that extend upwards from the substrate surface 1428. As the gate 1422 encompasses three sides of the semiconductor fin that extends from the source region 1424 to the drain region 1426, the transistor 1420 can be considered a tri-gate transistor. FIG. 14B illustrates one S/D fin extending through the gate 1422, but multiple S/D fins can extend through the gate of a FinFET transistor.

Figure 14C:
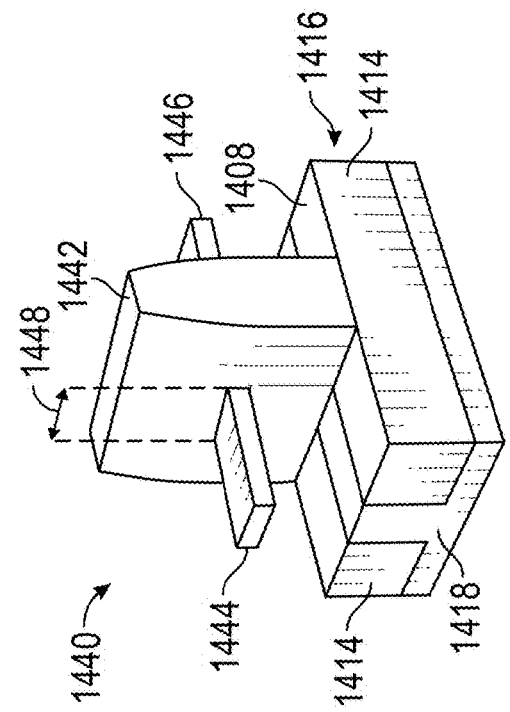

FIG. 14C is a perspective view of a gate-all-around (GAA) transistor 1440 comprising a gate 1442 that controls current flow between a source region 1444 and a drain region 1446. The transistor 1440 is non-planar in that the source region 1444 and the drain region 1446 are elevated from the substrate surface 1428.

FIG. 14D is a perspective view of a GAA transistor 1460 comprising a gate 1462 that controls current flow between multiple elevated source regions 1464 and multiple elevated drain regions 1466. The transistor 1460 is a stacked GAA transistor as the gate controls the flow of current between multiple elevated S/D regions stacked on top of each other. The transistors 1440 and 1460 are considered gate-all-around transistors as the gates encompass all sides of the semiconductor portions that extends from the source regions to the drain regions. The transistors 1440 and 1460 can alternatively be referred to as nanowire, nanosheet, or nanoribbon transistors depending on the width (e.g., widths 1448 and 1468 of transistors 1440 and 1460, respectively) of the semiconductor portions extending through the gate.

Returning to FIG. 13, a transistor 1340 may include a gate 1322 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1340 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1340 along the source-channel-drain direction, the gate electrode may consist of a U-shaped structure that includes a bottom portion substantially parallel to the surface of the die substrate 1302 and two sidewall portions that are substantially perpendicular to the top surface of the die substrate 1302. In other embodiments, at least one of the metal layers that form the gate electrode may simply be a planar layer that is substantially parallel to the top surface of the die substrate 1302 and does not include sidewall portions substantially perpendicular to the top surface of the die substrate 1302. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1320 may be formed within the die substrate 1302 adjacent to the gate 1322 of individual transistors 1340. The S/D regions 1320 may be formed using an implantation/diffusion process or an etching/deposition process, for example. In the former process, dopants such as boron, aluminum, antimony, phosphorous, or arsenic may be ion-implanted into the die substrate 1302 to form the S/D regions 1320. An annealing process that activates the dopants and causes them to diffuse farther into the die substrate 1302 may follow the ion-implantation process. In the latter process, the die substrate 1302 may first be etched to form recesses at the locations of the S/D regions 1320. An epitaxial deposition process may then be carried out to fill the recesses with material that is used to fabricate the S/D regions 1320. In some implementations, the S/D regions 1320 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1320 may be formed using one or more alternate semiconductor materials such as germanium or a group III-V material or alloy. In further embodiments, one or more layers of metal and/or metal alloys may be used to form the S/D regions 1320.

Electrical signals, such as power and/or input/output (I/O) signals, may be routed to and/or from the devices (e.g., transistors 1340) of the device layer 1304 through one or more interconnect layers disposed on the device layer 1304 (illustrated in FIG. 13 as interconnect layers 1306-1310). For example, electrically conductive features of the device layer 1304 (e.g., the gate 1322 and the S/D contacts 1324) may be electrically coupled with the interconnect structures 1328 of the interconnect layers 1306-1310. The one or more interconnect layers 1306-1310 may form a metallization stack (also referred to as an "ILD stack") 1319 of the integrated circuit device 1300.

The interconnect structures 1328 may be arranged within the interconnect layers 1306-1310 to route electrical signals according to a wide variety of designs; in particular, the arrangement is not limited to the particular configuration of interconnect structures 1328 depicted in FIG. 13. Although a particular number of interconnect layers 1306-1310 is depicted in FIG. 13, embodiments of the present disclosure include integrated circuit devices having more or fewer interconnect layers than depicted.

In some embodiments, the interconnect structures 1328 may include lines 1328a and/or vias 1328b filled with an electrically conductive material such as a metal. The lines 1328a may be arranged to route electrical signals in a direction of a plane that is substantially parallel with a surface of the die substrate 1302 upon which the device layer 1304 is formed. For example, the lines 1328a may route electrical signals in a direction in and out of the page and/or in a direction across the page from the perspective of FIG. 13. The vias 1328b may be arranged to route electrical signals in a direction of a plane that is substantially perpendicular to the surface of the die substrate 1302 upon which the device layer 1304 is formed. In some embodiments, the vias 1328b may electrically couple lines 1328a of different interconnect layers 1306-1310 together.

The interconnect layers 1306-1310 may include a dielectric material 1326 disposed between the interconnect structures 1328, as shown in FIG. 13. In some embodiments, dielectric material 1326 disposed between the interconnect structures 1328 in different ones of the interconnect layers 1306-1310 may have different compositions; in other embodiments, the composition of the dielectric material 1326 between different interconnect layers 1306-1310 may be the same. The device layer 1304 may include a dielectric material 1326 disposed between the transistors 1340 and a bottom layer of the metallization stack as well. The dielectric material 1326 included in the device layer 1304 may have a different composition than the dielectric material 1326 included in the interconnect layers 1306-1310; in other embodiments, the composition of the dielectric material 1326 in the device layer 1304 may be the same as a dielectric material 1326 included in any one of the interconnect layers 1306-1310.

A first interconnect layer 1306 (referred to as Metal 1 or "M1") may be formed directly on the device layer 1304. In some embodiments, the first interconnect layer 1306 may include lines 1328a and/or vias 1328b, as shown. The lines 1328a of the first interconnect layer 1306 may be coupled with contacts (e.g., the S/D contacts 1324) of the device layer 1304. The vias 1328b of the first interconnect layer 1306 may be coupled with the lines 1328a of a second interconnect layer 1308.

The second interconnect layer 1308 (referred to as Metal 2 or "M2") may be formed directly on the first interconnect layer 1306. In some embodiments, the second interconnect layer 1308 may include via 1328b to couple the lines 1328 of the second interconnect layer 1308 with the lines 1328a of a third interconnect layer 1310. Although the lines 1328a and the vias 1328b are structurally delineated with a line within individual interconnect layers for the sake of clarity, the lines 1328a and the vias 1328b may be structurally and/or materially contiguous (e.g., simultaneously filled during a dual-damascene process) in some embodiments.

The third interconnect layer 1310 (referred to as Metal 3 or "M3") (and additional interconnect layers, as desired) may be formed in succession on the second interconnect layer 1308 according to similar techniques and configurations described in connection with the second interconnect layer 1308 or the first interconnect layer 1306. In some embodiments, the interconnect layers that are "higher up" in the metallization stack 1319 in the integrated circuit device 1300 (i.e., farther away from the device layer 1304) may be thicker that the interconnect layers that are lower in the metallization stack 1319, with lines 1328a and vias 1328b in the higher interconnect layers being thicker than those in the lower interconnect layers.

The integrated circuit device 1300 may include a solder resist material 1334 (e.g., polyimide or similar material) and one or more conductive contacts 1336 formed on the interconnect layers 1306-1310. In FIG. 13, the conductive contacts 1336 are illustrated as taking the form of bond pads. The conductive contacts 1336 may be electrically coupled with the interconnect structures 1328 and configured to route the electrical signals of the transistor(s) 1340 to external devices. For example, solder bonds may be formed on the one or more conductive contacts 1336 to mechanically and/or electrically couple an integrated circuit die including the integrated circuit device 1300 with another component (e.g., a printed circuit board). The integrated circuit device 1300 may include additional or alternate structures to route the electrical signals from the interconnect layers 1306-1310; for example, the conductive contacts 1336 may include other analogous features (e.g., posts) that route the electrical signals to external components.

In some embodiments in which the integrated circuit device 1300 is a double-sided die, the integrated circuit device 1300 may include another metallization stack (not shown) on the opposite side of the device layer(s) 1304. This metallization stack may include multiple interconnect layers as discussed above with reference to the interconnect layers 1306-1310, to provide conductive pathways (e.g., including conductive lines and vias) between the device layer(s) 1304 and additional conductive contacts (not shown) on the opposite side of the integrated circuit device 1300 from the conductive contacts 1336.

In other embodiments in which the integrated circuit device 1300 is a double-sided die, the integrated circuit device 1300 may include one or more through silicon vias (TSVs) through the die substrate 1302; these TSVs may make contact with the device layer(s) 1304, and may provide conductive pathways between the device layer(s) 1304 and additional conductive contacts (not shown) on the opposite side of the integrated circuit device 1300 from the conductive contacts 1336. In some embodiments, TSVs extending through the substrate can be used for routing power and ground signals from conductive contacts on the opposite side of the integrated circuit device 1300 from the conductive contacts 1336 to the transistors 1340 and any other components integrated into the die 1300, and the metallization stack 1319 can be used to route I/O signals from the conductive contacts 1336 to transistors 1340 and any other components integrated into the die 1300.

Multiple integrated circuit devices 1300 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 15:
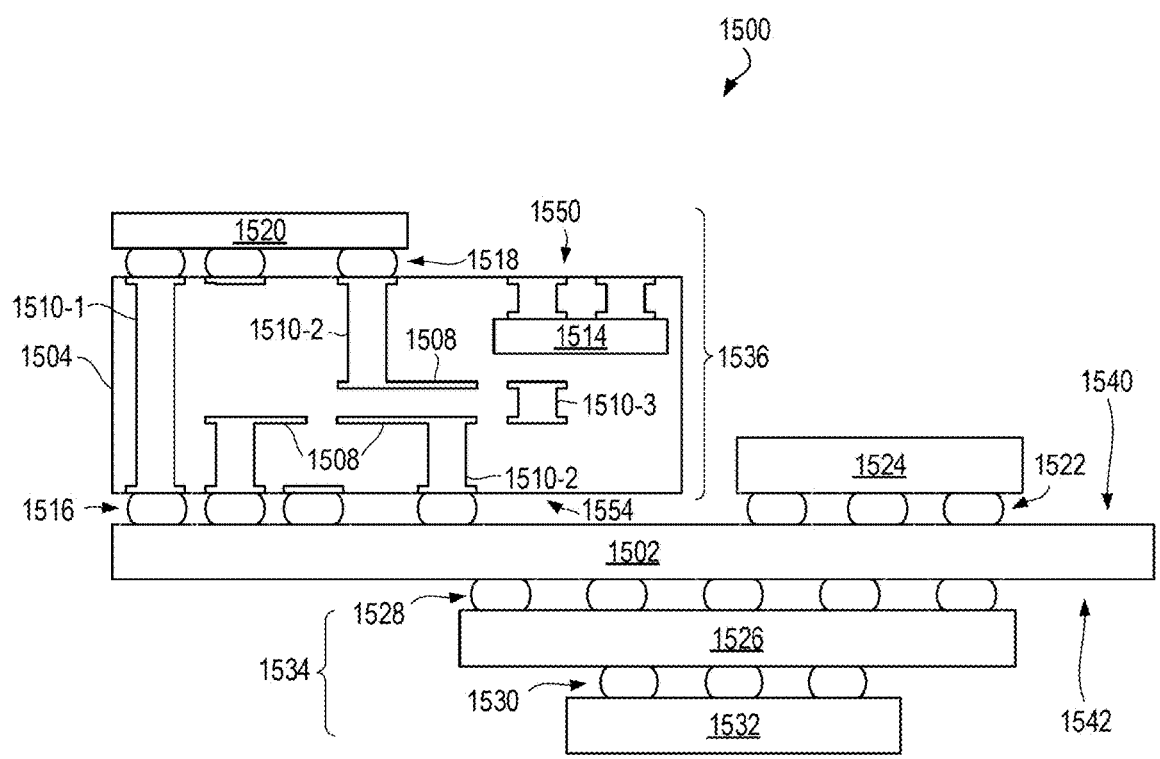
FIG. 15 is a cross-sectional side view of an integrated circuit device assembly that may include a microelectronic assembly, in accordance with any of the embodiments disclosed herein.

FIG. 15 is a cross-sectional side view of an integrated circuit device assembly 1500 that may include any of the FeFET-based pbit devices disclosed herein. In some embodiments, the integrated circuit device assembly 1500 may be a microelectronic assembly. The integrated circuit device assembly 1500 includes a number of components disposed on a circuit board 1502 (which may be a motherboard, system board, mainboard, etc.). The integrated circuit device assembly 1500 includes components disposed on a first face 1540 of the circuit board 1502 and an opposing second face 1542 of the circuit board 1502; generally, components may be disposed on one or both faces 1540 and 1542.

In some embodiments, the circuit board 1502 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1502. In other embodiments, the circuit board 1502 may be a non-PCB substrate. The integrated circuit device assembly 1500 illustrated in FIG. 15 includes a package-on-interposer structure 1536 coupled to the first face 1540 of the circuit board 1502 by coupling components 1516. The coupling components 1516 may electrically and mechanically couple the package-on-interposer structure 1536 to the circuit board 1502, and may include solder balls (as shown in FIG. 15), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1536 may include an integrated circuit component 1520 coupled to an interposer 1504 by coupling components 1518. The coupling components 1518 may take any suitable form for the application, such as the forms discussed above with reference to the coupling components 1516. Although a single integrated circuit component 1520 is shown in FIG. 15, multiple integrated circuit components may be coupled to the interposer 1504; indeed, additional interposers may be coupled to the interposer 1504. The interposer 1504 may provide an intervening substrate used to bridge the circuit board 1502 and the integrated circuit component 1520.

The integrated circuit component 1520 may be a packaged or unpacked integrated circuit product that includes one or more integrated circuit dies (e.g., the die 1202 of FIG. 12, the integrated circuit device 1300 of FIG. 13) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1520, a single monolithic integrated circuit die comprises solder bumps attached to contacts on the die. The solder bumps allow the die to be directly attached to the interposer 1504. The integrated circuit component 1520 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1520 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1520 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1520 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1504 may spread connections to a wider pitch or reroute a connection to a different connection. For example, the interposer 1504 may couple the integrated circuit component 1520 to a set of ball grid array (BGA) conductive contacts of the coupling components 1516 for coupling to the circuit board 1502. In the embodiment illustrated in FIG. 15, the integrated circuit component 1520 and the circuit board 1502 are attached to opposing sides of the interposer 1504; in other embodiments, the integrated circuit component 1520 and the circuit board 1502 may be attached to a same side of the interposer 1504. In some embodiments, three or more components may be interconnected by way of the interposer 1504.

In some embodiments, the interposer 1504 may be formed as a PCB, including multiple metal layers separated from one another by layers of dielectric material and interconnected by electrically conductive vias. In some embodiments, the interposer 1504 may be formed of an epoxy resin, a fiberglass-reinforced epoxy resin, an epoxy resin with inorganic fillers, a ceramic material, or a polymer material such as polyimide. In some embodiments, the interposer 1504 may be formed of alternate rigid or flexible materials that may include the same materials described above for use in a semiconductor substrate, such as silicon, germanium, and other group III-V and group IV materials. The interposer 1504 may include metal interconnects 1508 and vias 1510, including but not limited to through hole vias 1510-1 (that extend from a first face 1550 of the interposer 1504 to a second face 1554 of the interposer 1504), blind vias 1510-2 (that extend from the first or second faces 1550 or 1554 of the interposer 1504 to an internal metal layer), and buried vias 1510-3 (that connect internal metal layers).

In some embodiments, the interposer 1504 can comprise a silicon interposer. Through silicon vias (TSV) extending through the silicon interposer can connect connections on a first face of a silicon interposer to an opposing second face of the silicon interposer. In some embodiments, an interposer 1504 comprising a silicon interposer can further comprise one or more routing layers to route connections on a first face of the interposer 1504 to an opposing second face of the interposer 1504.

The interposer 1504 may further include embedded devices 1514, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1504. The package-on-interposer structure 1536 may take the form of any of the package-on-interposer structures known in the art. In embodiments where the interposer is a non-printed circuit board The integrated circuit device assembly 1500 may include an integrated circuit component 1524 coupled to the first face 1540 of the circuit board 1502 by coupling components 1522. The coupling components 1522 may take the form of any of the embodiments discussed above with reference to the coupling components 1516, and the integrated circuit component 1524 may take the form of any of the embodiments discussed above with reference to the integrated circuit component 1520.

The integrated circuit device assembly 1500 illustrated in FIG. 15 includes a package-on-package structure 1534 coupled to the second face 1542 of the circuit board 1502 by coupling components 1528. The package-on-package structure 1534 may include an integrated circuit component 1526 and an integrated circuit component 1532 coupled together by coupling components 1530 such that the integrated circuit component 1526 is disposed between the circuit board 1502 and the integrated circuit component 1532. The coupling components 1528 and 1530 may take the form of any of the embodiments of the coupling components 1516 discussed above, and the integrated circuit components 1526 and 1532 may take the form of any of the embodiments of the integrated circuit component 1520 discussed above. The package-on-package structure 1534 may be configured in accordance with any of the package-on-package structures known in the art.

Figure 16:
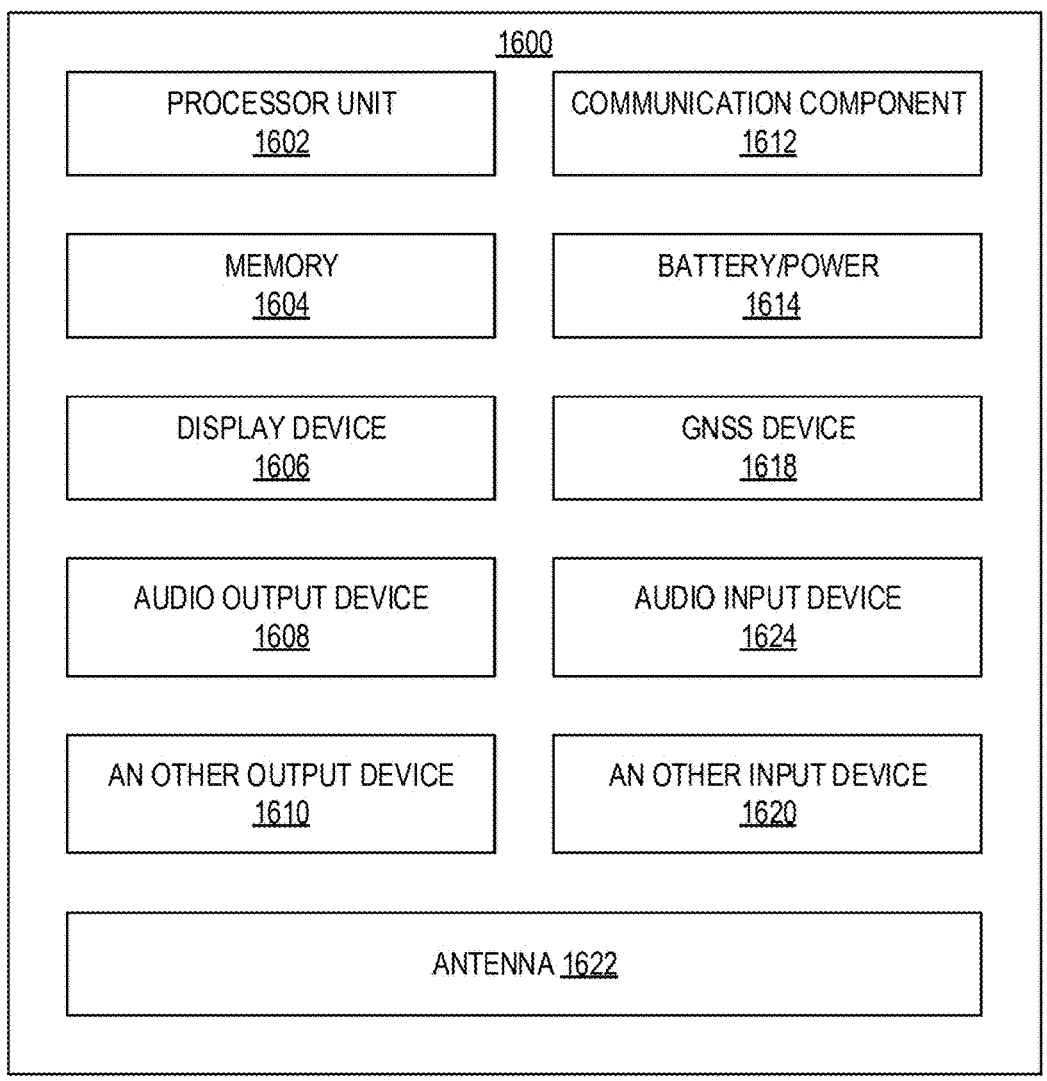
FIG. 16 is a block diagram of an example electrical device that may include a microelectronic assembly, in accordance with any of the embodiments disclosed herein.

FIG. 16 is a block diagram of an example electrical device 1600 that may include one or more of the FeFET-based pbit devices disclosed herein. For example, any suitable ones of the components of the electrical device 1600 may include one or more of the integrated circuit device assemblies 1500, integrated circuit components 1520, integrated circuit devices 1300, or integrated circuit dies 1202 disclosed herein. A number of components are illustrated in FIG. 16 as included in the electrical device 1600, but any one or more of these components may be omitted or duplicated, as suitable for the application. In some embodiments, some or all of the components included in the electrical device 1600 may be attached to one or more motherboards mainboards, or system boards. In some embodiments, one or more of these components are fabricated onto a single system-on-a-chip (SoC) die.

Additionally, in various embodiments, the electrical device 1600 may not include one or more of the components illustrated in FIG. 16, but the electrical device 1600 may include interface circuitry for coupling to the one or more components. For example, the electrical device 1600 may not include a display device 1606, but may include display device interface circuitry (e.g., a connector and driver circuitry) to which a display device 1606 may be coupled. In another set of examples, the electrical device 1600 may not include an audio input device 1624 or an audio output device 1608, but may include audio input or output device interface circuitry (e.g., connectors and supporting circuitry) to which an audio input device 1624 or audio output device 1608 may be coupled.

The electrical device 1600 may include one or more processor units 1602 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1602 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1600 may include a memory 1604, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1604 may include memory that is located on the same integrated circuit die as the processor unit 1602. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1600 can comprise one or more processor units 1602 that are heterogeneous or asymmetric to another processor unit 1602 in the electrical device 1600. There can be a variety of differences between the processing units 1602 in a system in terms of a spectrum of metrics of merit including architectural, microarchitectural, thermal, power consumption characteristics, and the like. These differences can effectively manifest themselves as asymmetry and heterogeneity among the processor units 1602 in the electrical device 1600.

In some embodiments, the electrical device 1600 may include a communication component 1612 (e.g., one or more communication components). For example, the communication component 1612 can manage wireless communications for the transfer of data to and from the electrical device 1600. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1612 may operate in accordance with other wireless protocols in other embodiments. The electrical device 1600 may include an antenna 1622 to facilitate wireless communications and/or to receive other wireless communications (such as AM or FM radio transmissions).

In some embodiments, the communication component 1612 may manage wired communications, such as electrical, optical, or any other suitable communication protocols (e.g., IEEE 802.3 Ethernet standards). As noted above, the communication component 1612 may include multiple communication components. For instance, a first communication component 1612 may be dedicated to shorter-range wireless communications such as Wi-Fi or Bluetooth, and a second communication component 1612 may be dedicated to longer-range wireless communications such as global positioning system (GPS), EDGE, GPRS, CDMA, WiMAX, LTE, EV-DO, or others. In some embodiments, a first communication component 1612 may be dedicated to wireless communications, and a second communication component 1612 may be dedicated to wired communications.

The electrical device 1600 may include battery/power circuitry 1614. The battery/power circuitry 1614 may include one or more energy storage devices (e.g., batteries or capacitors) and/or circuitry for coupling components of the electrical device 1600 to an energy source separate from the electrical device 1600 (e.g., AC line power).

The electrical device 1600 may include a display device 1606 (or corresponding interface circuitry, as discussed above). The display device 1606 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1600 may include an audio output device 1608 (or corresponding interface circuitry, as discussed above). The audio output device 1608 may include any embedded or wired or wirelessly connected external device that generates an audible indicator, such speakers, headsets, or earbuds.

The electrical device 1600 may include an audio input device 1624 (or corresponding interface circuitry, as discussed above). The audio input device 1624 may include any embedded or wired or wirelessly connected device that generates a signal representative of a sound, such as microphones, microphone arrays, or digital instruments (e.g., instruments having a musical instrument digital interface (MIDI) output). The electrical device 1600 may include a Global Navigation Satellite System (GNSS) device 1618 (or corresponding interface circuitry, as discussed above), such as a Global Positioning System (GPS) device. The GNSS device 1618 may be in communication with a satellite-based system and may determine a geolocation of the electrical device 1600 based on information received from one or more GNSS satellites, as known in the art.

The electrical device 1600 may include an other output device 1610 (or corresponding interface circuitry, as discussed above). Examples of the other output device 1610 may include an audio codec, a video codec, a printer, a wired or wireless transmitter for providing information to other devices, or an additional storage device.

The electrical device 1600 may include an other input device 1620 (or corresponding interface circuitry, as discussed above). Examples of the other input device 1620 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1600 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1600 may be any other electronic device that processes data. In some embodiments, the electrical device 1600 may comprise multiple discrete physical components. Given the range of devices that the electrical device 1600 can be manifested as in various embodiments, in some embodiments, the electrical device 1600 can be referred to as a computing device or a computing system.

Some examples of embodiments are provided below. As used in the following examples, the term "connected" may refer to an electrical connection. In some instances, the connection may be a direct connection between two items/components. Further, as used in the following examples, the term "coupled" may refer to a connection that may be direct or indirect. For example, a first component coupled to a second component may include a third component connected between the first and second components.

Example 1 includes an apparatus comprising: a first field-effect transistor (FET) comprising: a source region; a drain region; a source electrode on the source region; a drain electrode on the drain region; a channel region between the source and drain regions; a dielectric layer on a surface over the channel region; an electrode layer above the dielectric layer; and a ferroelectric (FE) material layer between the dielectric layer and the electrode layer; and a second FET comprising a source electrode, a drain electrode, and a gate electrode, wherein the drain electrode of the second FET is connected to the drain electrode of the first FET.

Example 2 includes the subject matter of Example 1, further comprising: a third FET comprising a source electrode, a drain electrode, and a gate electrode, wherein the drain electrode of the third FET is connected to a first supply voltage terminal, the gate electrode of the third FET is connected to a first clock signal terminal, and the drain electrode of the third FET is connected to the electrode layer of the first FET; a fourth FET comprising a source electrode, a drain electrode, and a gate electrode, wherein the drain electrode of the fourth FET is connected to a second supply voltage terminal, the gate electrode of the fourth FET is connected to a second clock signal terminal, and the drain electrode of the fourth FET is connected to the electrode layer of the first FET; and a fifth FET comprising a source electrode, a drain electrode, and a gate electrode, wherein the gate electrode of the fifth FET is connected to a third clock signal terminal, and the drain electrode of the fifth FET is connected to the electrode layer of the first FET.

Example 3 includes the subject matter of Example 1, wherein the electrode layer is a first electrode layer, and the first FET further comprises a second electrode layer between the FE material layer and the dielectric layer.

Example 4 includes the subject matter of Example 3, further comprising: a third FET comprising a source electrode, a drain electrode, and a gate electrode, wherein the drain electrode of the third FET is connected to a first supply voltage terminal, the gate electrode of the third FET is connected to a first clock signal terminal, and the drain electrode of the third FET is connected to the electrode layer of the first FET; a fourth FET comprising a source electrode, a drain electrode, and a gate electrode, wherein the drain electrode of the fourth FET is connected to a second supply voltage terminal, the gate electrode of the fourth FET is connected to a second clock signal terminal, and the drain electrode of the fourth FET is connected to the electrode layer of the first FET; and a fifth FET comprising a source electrode, a drain electrode, and a gate electrode, wherein the drain electrode of the fifth FET is connected to a third supply voltage terminal, the gate electrode of the fifth FET is connected to a third clock signal terminal, and the drain electrode of the fifth FET is connected to the electrode layer of the first FET.

Example 5 includes the subject matter of Example 3 or 4, further comprising a sixth FET comprising a source electrode, a drain electrode, and a gate electrode, wherein the gate electrode of the sixth FET is connected to the third clock signal terminal, and the drain electrode of the third FET is connected to the second electrode layer of the first FET.

Example 6 includes the subject matter of any one of Examples 1-5, further comprising a D flip-flip circuit connected to the drain electrodes of the first and second FETs.

Example 7 includes the subject matter of any one of Examples 1-6, wherein the first FET is an n-channel FET and the source electrode of the first FET is connected to a ground terminal, the second FET is a p-channel FET and the source electrode of the second FET is connected to a supply voltage terminal.

Example 8 includes the subject matter of any one of Examples 1-6, wherein the first FET is a p-channel FET and the source electrode of the first FET is connected to a supply voltage terminal, and the second FET is an n-channel FET and the source electrode of the second FET is connected to a ground terminal.

Example 9 includes the subject matter of any one of Examples 1-8, wherein the FE material comprises hafnium and oxygen.

Example 10 includes the subject matter of any one of Examples 1-9, wherein the first FET is a planar FET.

Example 11 includes the subject matter of any one of Examples 1-9, wherein the first FET is a non-planar FET.

Example 12 includes a system comprising: a plurality of pbit devices, each pbit device comprising: a field-effect transistor (FET) comprising: a source region; a drain region; a source electrode on the source region; a drain electrode on the drain region; a channel region between the source and drain regions; and a layer stack on a surface of the FET over the channel region, the layer stack comprising a dielectric layer, an electrode layer, and a ferroelectric (FE) material layer; an input node coupled to the electrode layer of the FET; and an output node coupled to the drain electrode of the FET; wherein the input node of each pbit device is coupled to an output node of one or more other pbit devices.

Example 13 includes the subject matter of Example 12, wherein the input node of a first pbit device is coupled to output nodes of a second pbit device and a third pbit device through a circuit comprising: a first resistor connected to the output node of the second pbit device; a second resistor connected to the output node of the third pbit device; and an opamp circuit comprising a positive input terminal, a negative input terminal, and an output terminal; wherein the positive input terminal of the opamp circuit is connected to a reference voltage source, the negative input terminal the opamp circuit is connected to the first and second resistors and to the output terminal via a third resistor, and the output terminal is coupled to the input node of the first pbit device.

Example 14 includes the subject matter of Example 13, wherein the first and second resistor are configurable resistors.

Example 15 includes the subject matter of Example 12, wherein the input node of a first pbit device is coupled to output nodes of a second pbit device and a third pbit device through a circuit comprising: a first capacitor connected to the output node of the second pbit device; a second capacitor connected to the output node of the third pbit device; and an opamp circuit comprising a positive input terminal, a negative input terminal, and an output terminal; wherein the positive input terminal of the opamp circuit is connected to a reference voltage source, the negative input terminal the opamp circuit is connected to the first and second capacitors and to the output terminal via a third capacitor and a FET is parallel, and the output terminal is coupled to the input node of the first pbit device.

Example 16 includes the subject matter of any one of Examples 12-15, wherein each pbit device further comprises a D flip-flop circuit, the drain electrode of the FET is connected to an input of the D flip-flop circuit, and the output node of the pbit device is connected to an output of the D flip-flop circuit.

Example 17 includes the subject matter of any one of Examples 12-16, wherein the layer stack FET of each pbit device comprises the FE material layer between the dielectric layer and the electrode layer.

Example 18 includes the subject matter of any one of Examples 12-17, further comprising pulse generation circuitry comprising: a first voltage source; a second voltage source; a first clock signal generator; a second clock signal generator; a third clock signal generator; a first FET comprising a source electrode, a drain electrode, and a gate electrode, wherein the drain electrode of the first FET is connected to the first voltage source, the gate electrode of the first FET is connected to the first clock signal generator, and the drain electrode of the first FET is connected to the input node of each pbit device; a second FET comprising a source electrode, a drain electrode, and a gate electrode, wherein the drain electrode of the second FET is connected to the second voltage source, the gate electrode of the first FET is connected to the second clock signal generator, and the drain electrode of the first FET is connected to the input node of each pbit device; and a third FET comprising a source electrode, a drain electrode, and a gate electrode, wherein the drain electrode of the third FET is coupled to the output node of one or more other pbit devices, the gate electrode of the third FET is connected to the third clock signal generator, and the drain electrode of the first FET is connected to the input node of each pbit device.

Example 19 includes the subject matter of any one of Examples 12-16, wherein the electrode layer of at least one pbit device is a first electrode layer, the layer stack of the at least one pbit device further comprises a second electrode layer, the FE material is between the first and second electrode layers.

Example 20 includes the subject matter of Example 19, further comprising pulse generation circuitry comprising: a first voltage source; a second voltage source; a third voltage source; a first clock signal generator; a second clock signal generator; a third clock signal generator; a first FET comprising a source electrode, a drain electrode, and a gate electrode, wherein the drain electrode of the first FET is connected to the first voltage source, the gate electrode of the first FET is connected to the first clock signal generator, and the drain electrode of the first FET is connected to the second electrode layer of each pbit device; a second FET comprising a source electrode, a drain electrode, and a gate electrode, wherein the drain electrode of the second FET is connected to the second voltage source, the gate electrode of the first FET is connected to the second clock signal generator, and the drain electrode of the first FET is connected to the second electrode layer of each pbit device; and a third FET comprising a source electrode, a drain electrode, and a gate electrode, wherein the drain electrode of the third FET is coupled to the third voltage source, the gate electrode of the third FET is connected to the third clock signal generator, and the drain electrode of the first FET is connected to the second electrode layer of each pbit device.

Example 21 includes the subject matter of any one of Examples 12-20, wherein the FET of each pbit device is a first FET of the pbit device, and each pbit device further comprises a second FET comprising a source electrode, a drain electrode, and a gate electrode, wherein the drain electrode of the second FET is connected to the drain electrode of the first FET.

Example 22 includes a method of operating a field-effect transistor (FET) with a ferroelectric (FE) material layer, the method comprising: applying a number of pulse cycles to a gate electrode of the FET, each pulse cycle comprising: a reset pulse during a first time period, wherein a magnitude of the reset pulse is to deterministically set a polarization state of the FE material layer of the FET; a write pulse during a second time period after the first time period; and a read pulse during a third time period after the third time period, wherein a magnitude of the read pulse is to be between a first threshold voltage of the FET based on a first polarization state of the FE material layer and a second threshold voltage of the FET based on a second polarization state of the FE material layer; and determining, for each pulse cycle, a polarization state of the FE material layer based on the read pulse of the pulse cycle.

Example 23 includes the subject matter of Example 22, further comprising determining a statistical probability of the polarization state of the FE material layer after the number of pulse cycles.

Example 24 includes the subject matter of Example 22, wherein a magnitude of each write pulse is based on an output voltage of at least one other FET with a FE material layer, the output voltage of the at least one other FET based on a polarization state of the FE material layer of the FET.

Example 25 includes the subject matter of Example 24, wherein the magnitude of each write pulse is based on a sum of the output voltages.

Example 26 includes a computer-readable medium comprising instructions that, when executed by a machine, cause the machine to implement the method of any one of Examples 22-25.

Example 27 includes an apparatus comprising means to implement the method of any one of Examples 22-25.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

The invention claimed is:

1. An apparatus comprising:
   a first field-effect transistor (FET) comprising:
   a source region;
   a drain region;
   a source electrode on the source region;
   a drain electrode on the drain region;
   a channel region between the source and drain regions;
   a dielectric layer on a surface over the channel region;
   an electrode layer above the dielectric layer; and
   a ferroelectric (FE) material layer between the dielectric layer and the electrode layer;
   a second FET comprising a source electrode, a drain electrode, and a gate electrode, wherein the drain electrode of the second FET is connected to the drain electrode of the first FET; and
   a D flip-flop circuit connected to the drain electrode of the first FET and the drain electrode of the second FET.

2. The apparatus of claim 1, further comprising:
   a third FET comprising a source electrode, a drain electrode, and a gate electrode, wherein the drain electrode of the third FET is connected to a first supply voltage terminal, the gate electrode of the third FET is connected to a first clock signal terminal, and the drain electrode of the third FET is connected to the electrode layer of the first FET;
   a fourth FET comprising a source electrode, a drain electrode, and a gate electrode, wherein the drain electrode of the fourth FET is connected to a second supply voltage terminal, the gate electrode of the fourth FET is connected to a second clock signal terminal, and the drain electrode of the fourth FET is connected to the electrode layer of the first FET; and
   a fifth FET comprising a source electrode, a drain electrode, and a gate electrode, wherein the gate electrode of the fifth FET is connected to a third clock signal terminal, and the drain electrode of the fifth FET is connected to the electrode layer of the first FET.

3. The apparatus of claim 1, wherein the electrode layer is a first electrode layer, and the first FET further comprises a second electrode layer between the FE material layer and the dielectric layer.

4. The apparatus of claim 3, further comprising
   a third FET comprising a source electrode, a drain electrode, and a gate electrode, wherein the drain electrode of the third FET is connected to a first supply voltage terminal, the gate electrode of the third FET is connected to a first clock signal terminal, and the drain electrode of the third FET is connected to the electrode layer of the first FET;
   a fourth FET comprising a source electrode, a drain electrode, and a gate electrode, wherein the drain electrode of the fourth FET is connected to a second supply voltage terminal, the gate electrode of the fourth FET is connected to a second clock signal terminal, and the drain electrode of the fourth FET is connected to the electrode layer of the first FET; and
   a fifth FET comprising a source electrode, a drain electrode, and a gate electrode, wherein the drain electrode of the fifth FET is connected to a third supply voltage terminal, the gate electrode of the fifth FET is connected to a third clock signal terminal, and the drain electrode of the fifth FET is connected to the electrode layer of the first FET.

5. The apparatus of claim 4, further comprising a sixth FET comprising a source electrode, a drain electrode, and a gate electrode, wherein the gate electrode of the sixth FET is connected to the third clock signal terminal, and the drain electrode of the third FET is connected to the second electrode layer of the first FET.

6. The apparatus of claim 1, wherein the first FET is an n-channel FET and the source electrode of the first FET is connected to a ground terminal, the second FET is a p-channel FET and the source electrode of the second FET is connected to a supply voltage terminal.

7. The apparatus of claim 1, wherein the first FET is a p-channel FET and the source electrode of the first FET is connected to a supply voltage terminal, and the second FET is an n-channel FET and the source electrode of the second FET is connected to a ground terminal.

8. The apparatus of claim 1, wherein the FE material comprises hafnium and oxygen.

9. The apparatus of claim 1, wherein the first FET is a planar FET.

10. The apparatus of claim 1, wherein the first FET is a non-planar FET.

11. A system comprising:
    a plurality of pbit devices, each pbit device comprising:
    a field-effect transistor (FET) comprising:
       a source region;
       a drain region;
       a source electrode on the source region;
       a drain electrode on the drain region;
       a channel region between the source and drain regions; and
       a layer stack on a surface of the FET over the channel region, the layer stack comprising a dielectric layer, an electrode layer, and a ferroelectric (FE) material layer;
    an input node coupled to the electrode layer of the FET; and
    an output node coupled to the drain electrode of the FET;
    wherein the input node of each pbit device is coupled to an output node of one or more other pbit devices.

12. The system of claim 11, wherein the input node of a first pbit device is coupled to output nodes of a second pbit device and a third pbit device through a circuit comprising:
    a first resistor connected to the output node of the second pbit device;

a second resistor connected to the output node of the third pbit device; and an opamp circuit comprising a positive input terminal, a negative input terminal, and an output terminal;

wherein the positive input terminal of the opamp circuit is connected to a reference voltage source, the negative input terminal the opamp circuit is connected to the first and second resistors and to the output terminal via a third resistor, and the output terminal is coupled to the input node of the first pbit device.

13. The system of claim 12, wherein the first and second resistor are configurable resistors.

14. The system of claim 11, wherein the input node of a first pbit device is coupled to output nodes of a second pbit device and a third pbit device through a circuit comprising:

a first capacitor connected to the output node of the second pbit device;

a second capacitor connected to the output node of the third pbit device; and an opamp circuit comprising a positive input terminal, a negative input terminal, and an output terminal;

wherein the positive input terminal of the opamp circuit is connected to a reference voltage source, the negative input terminal the opamp circuit is connected to the first and second capacitors and to the output terminal via a third capacitor and a FET is parallel, and the output terminal is coupled to the input node of the first pbit device.

15. The system of claim 11, wherein each pbit device further comprises a D flip-flop circuit, the drain electrode of the FET is connected to an input of the D flip-flop circuit, and the output node of the pbit device is connected to an output of the D flip-flop circuit.

16. The system of claim 11, wherein the layer stack FET of each pbit device comprises the FE material layer between the dielectric layer and the electrode layer.

17. The system of claim 11, further comprising pulse generation circuitry comprising:

a first voltage source;
a second voltage source;
a first clock signal generator;
a second clock signal generator;
a third clock signal generator;
a first FET comprising a source electrode, a drain electrode, and a gate electrode, wherein the drain electrode of the first FET is connected to the first voltage source, the gate electrode of the first FET is connected to the first clock signal generator, and the drain electrode of the first FET is connected to the input node of each pbit device;

a second FET comprising a source electrode, a drain electrode, and a gate electrode, wherein the drain electrode of the second FET is connected to the second voltage source, the gate electrode of the first FET is connected to the second clock signal generator, and the drain electrode of the first FET is connected to the input node of each pbit device; and a third FET comprising a source electrode, a drain electrode, and a gate electrode, wherein the drain electrode of the third FET is coupled to the output node of one or more other pbit devices, the gate electrode of the third FET is connected to the third clock signal generator, and the drain electrode of the first FET is connected to the input node of each pbit device.

18. The system of claim 11, wherein the electrode layer of at least one pbit device is a first electrode layer, the layer stack of the at least one pbit device further comprises a second electrode layer, the FE material is between the first and second electrode layers.

19. The system of claim 18, further comprising pulse generation circuitry comprising:

a first voltage source;
a second voltage source;
a third voltage source;
a first clock signal generator;
a second clock signal generator;
a third clock signal generator;
a first FET comprising a source electrode, a drain electrode, and a gate electrode, wherein the drain electrode of the first FET is connected to the first voltage source, the gate electrode of the first FET is connected to the first clock signal generator, and the drain electrode of the first FET is connected to the second electrode layer of each pbit device;

a second FET comprising a source electrode, a drain electrode, and a gate electrode, wherein the drain electrode of the second FET is connected to the second voltage source, the gate electrode of the first FET is connected to the second clock signal generator, and the drain electrode of the first FET is connected to the second electrode layer of each pbit device; and a third FET comprising a source electrode, a drain electrode, and a gate electrode, wherein the drain electrode of the third FET is coupled to the third voltage source, the gate electrode of the third FET is connected to the third clock signal generator, and the drain electrode of the first FET is connected to the second electrode layer of each pbit device.

20. The system of claim 11, wherein the FET of each pbit device is a first FET of the pbit device, and each pbit device further comprises a second FET comprising a source electrode, a drain electrode, and a gate electrode, wherein the drain electrode of the second FET is connected to the drain electrode of the first FET.

21. A method of operating a field-effect transistor (FET) with a ferroelectric (FE) material layer, the method comprising:

applying a number of pulse cycles to a gate electrode of the FET, each pulse cycle comprising:

a reset pulse during a first time period, wherein a magnitude of the reset pulse is to deterministically set a polarization state of the FE material layer of the FET;

a write pulse during a second time period after the first time period; and a read pulse during a third time period after the third time period, wherein a magnitude of the read pulse is to be between a first threshold voltage of the FET based on a first polarization state of the FE material layer and a second threshold voltage of the FET based on a second polarization state of the FE material layer; and determining, for each pulse cycle, a polarization state of the FE material layer based on the read pulse of the pulse cycle.

22. The method of claim 21, further comprising determining a statistical probability of the polarization state of the FE material layer after the number of pulse cycles.

23. The method of claim 21, wherein a magnitude of each write pulse is based on an output voltage of at least one other FET with a FE material layer, the output voltage of the at least one other FET based on a polarization state of the FE material layer of the FET.

24. The method of claim 23, wherein the magnitude of each write pulse is based on a sum of the output voltages.

* * * * *